(12) United States Patent
Gunnarsson et al.

(10) Patent No.: US 11,287,904 B2
(45) Date of Patent: Mar. 29, 2022

(54) VIRTUAL/AUGMENTED REALITY MODELING APPLICATION FOR ARCHITECTURE

(71) Applicant: ARKIO EHF., Reykjavik (IS)

(72) Inventors: Hilmar Gunnarsson, Gardabaer (IS); Haraldur Darri Thorvaldsson, Reykjavik (IS); Charles Palmer, Reykjavik (IS); Vilhelm Saevarsson, Hafnarfjordur (IS)

(73) Assignee: ARKIO EHF., Reykjavik (IS)

( * ) Notice: Subject to any disclaimer, the term of this patent is extended or adjusted under 35 U.S.C. 154(b) by 0 days.

(21) Appl. No.: 16/922,581

(22) Filed: Jul. 7, 2020

(65) Prior Publication Data

US 2020/0333889 A1    Oct. 22, 2020

Related U.S. Application Data

(63) Continuation of application No. 16/188,867, filed on Nov. 13, 2018, now Pat. No. 10,754,443.

(Continued)

(51) Int. Cl.
*G06F 3/0346* (2013.01)
*G06F 30/13* (2020.01)
(Continued)

(52) U.S. Cl.
CPC ............ *G06F 3/0346* (2013.01); *B33Y 50/00* (2014.12); *G06F 3/011* (2013.01); *G06F 3/014* (2013.01);
(Continued)

(58) Field of Classification Search
CPC ........ G06F 3/0346; G06F 3/011; G06F 3/014; G06F 3/0481; G06F 3/04815;
(Continued)

(56) References Cited

U.S. PATENT DOCUMENTS

2007/0013724 A1    1/2007  Swift
2009/0079734 A1    3/2009  McDaniel
(Continued)

OTHER PUBLICATIONS

International Search Report and the Written Opinion of the International Searching Authority from corresponding PCT/IB2018/058929 dated Feb. 12, 2019.

(Continued)

*Primary Examiner* — Stephen G Sherman
(74) *Attorney, Agent, or Firm* — Lando & Anastasi, LLP

(57) ABSTRACT

According to one aspect, an architectural modeling system is provided. The system includes an input controller configured to generate one or more input signals, a display including a display screen, and a system controller configured to be coupled to the input controller and the display. The system controller is configured to generate a three-dimensional simulated environment, display a field of view of the simulated environment on the display screen, receive, from the input controller, the one or more input signals indicative of a three-dimensional movement of the input controller, generate, based on the one or more input signals, a virtual object represented as a polyhedral volumetric object, and display the virtual object in the field of view of the simulated environment on the display screen.

20 Claims, 31 Drawing Sheets

Related U.S. Application Data

(60) Provisional application No. 62/585,025, filed on Nov. 13, 2017.

(51) Int. Cl.

| | | |
|---|---|---|
| *G06F 3/0481* | (2013.01) | |
| *G06T 15/08* | (2011.01) | |
| *G06T 17/10* | (2006.01) | |
| *G06T 19/20* | (2011.01) | |
| *G06F 3/01* | (2006.01) | |
| *G06F 3/04815* | (2022.01) | |
| *B33Y 50/00* | (2015.01) | |
| *G06F 3/0354* | (2013.01) | |

(52) U.S. Cl.
CPC ........ *G06F 3/0481* (2013.01); *G06F 3/04815* (2013.01); *G06F 30/13* (2020.01); *G06T 15/08* (2013.01); *G06T 17/10* (2013.01); *G06T 19/20* (2013.01); *G06F 3/03547* (2013.01); *G06T 2200/24* (2013.01); *G06T 2210/04* (2013.01); *G06T 2210/21* (2013.01); *G06T 2219/2016* (2013.01); *G06T 2219/2021* (2013.01)

(58) Field of Classification Search
CPC ............. G06F 3/03547; G06F 17/5004; G06F 17/10; B33Y 50/00; G06T 15/08; G06T 19/20; G06T 2200/24; G06T 2210/04; G06T 2210/21; G06T 2219/2016; G06T 2219/2021

See application file for complete search history.

(56) References Cited

U.S. PATENT DOCUMENTS

| | | |
|---|---|---|
| 2015/0199850 A1 | 7/2015 | Uematsu et al. |
| 2016/0062489 A1 | 3/2016 | Li |
| 2017/0083104 A1 | 3/2017 | Namba et al. |

OTHER PUBLICATIONS

W. Piekarski et al., "Tinmith-Metro: New outdoor techniques for creating city models with an augmented reality wearable computer", Proceedings of the Fifth International Symposium on Wearable Computers, pp. 31-38 (Oct. 8-9, 2001), XP055549878, DOI: 10.1109/ISWC.2001.962093, ISBN: 978-0-7695-1318-8.

D. Mendes et al., "Mid-air modeling with Boolean operations in VR", 2017 IEEE Symposium on 3D User Interfaces (3DUI), pp. 154-157 (Mar. 18-19, 2017), XP033084055, DOI: 10.1109/3DUI.2017.7893332 (retrieved Apr. 5, 2017).

VIRTUAL/AUGMENTED REALITY MODELING APPLICATION FOR ARCHITECTURE

CROSS-REFERENCE TO RELATED APPLICATIONS

This application claims priority under 35 U.S.C. § 120 as a continuation of U.S. patent application Ser. No. 16/188,867, titled "VIRTUAL/AUGMENTED REALITY MODELING APPLICATION FOR ARCHITECTURE," filed Nov. 13, 2018, which claims priority under 35 U.S.C. § 119(e) to U.S. Provisional Application Ser. No. 62/585,025, titled "VIRTUAL/AUGMENTED REALITY MODELING APPLICATION FOR ARCHITECTURE," filed on Nov. 13, 2017. Each of these applications is herein incorporated by reference in its entirety for all purposes.

BACKGROUND OF THE INVENTION

1. Field of the Invention

At least one example in accordance with the present invention relates generally to modeling systems and methods.

2. Discussion of Related Art

The use of modeling software to generate models of geometric assemblies is known. Furthermore, it is known for architects or other building design professionals to use modeling software to model building structures. Conventional modeling software is typically executed on a computer implementing a two-dimensional (2D) monitor display.

Virtual Reality (VR) and Augmented Reality (AR) are increasingly becoming an area of technical interest for many industries. VR generally refers to the exposure of a user to purely computer-generated stimuli, including visual stimuli. In contrast, AR generally refers to the exposure of a user to a combination of real and computer-generated stimuli. VR and AR systems are particularly popular in the entertainment industry.

SUMMARY

According to one aspect, an architectural modeling system is provided. The system includes an input controller configured to generate one or more input signals, a display including a display screen, and a system controller configured to be coupled to the input controller and the display. The system controller is configured to generate a three-dimensional simulated environment, display a field of view of the simulated environment on the display screen, receive, from the input controller, the one or more input signals indicative of a three-dimensional movement of an input controller, generate, based on the one or more input signals, a virtual object represented as a polyhedral volumetric object, and display the virtual object in the field of view of the simulated environment on the display screen.

In one embodiment, the input controller includes one or more sensors and one or more actuators, and wherein the input controller is configured to detect, with an actuator of the one or more actuators, an actuation of the actuator, detect, with the one or more sensors, a single continuous movement of the input controller, generate, responsive to detecting the actuation of the actuator and the single continuous movement of the input controller, an object generation signal, and communicate the object generation signal to the system controller, wherein the one or more input signals include the object generation signal.

In some embodiments, the input controller is further configured to detect, with the one or more sensors, a tilted orientation of the input controller, generate, responsive to detecting the tilted orientation of the input controller, a controller orientation signal, and provide the controller orientation signal to the system controller, wherein the one or more input signals include the controller orientation signal. In an embodiment, the system controller is configured to generate, responsive to receiving the one or more input signals including the controller orientation signal, a cross-section view of the virtual object.

In at least one embodiment, a plurality of virtual objects is provided, wherein each virtual object of the plurality of virtual objects is represented as a polyhedral volumetric object. In an embodiment, the virtual object includes a first feature and a second feature, and wherein the system controller is configured to restrict the first feature based on at least one of the second feature of the virtual object and a third feature of at least one second virtual object of the plurality of virtual objects. In some embodiments, the plurality of virtual objects includes a first virtual object and a second virtual object, and wherein the system controller is configured to combine the first virtual object and the second virtual object responsive to detecting a collision between the first virtual object and the second virtual object.

In an embodiment, detecting the collision between the first virtual object and the second virtual object includes detecting an overlap between the first virtual object and the second virtual object. In some embodiments, the system controller is further configured to model physical interactions in the three-dimensional simulated environment in accordance with the laws of physics. In at least one embodiment, the system is configured to be coupled to a three-dimensional printer, and wherein the system is configured to provide a file encoding the virtual object to the three-dimensional printer.

In some embodiments, the system controller is further configured to generate a second virtual object, and combine the virtual object with the second virtual object responsive to receiving the one or more input signals representing a bashing operation of the virtual object with the second virtual object. In at least one embodiment, the system controller is further configured to be coupled to a plurality of input controllers.

According to one embodiment, a method of modeling architectural objects is provided. The method includes generating a three-dimensional simulated environment, providing first display signals indicative of a field of view of the simulated environment to a display, receiving one or more input signals including a signal indicative of a three-dimensional gesture, generating, based on the one or more input signals, a virtual object represented as a polyhedral volumetric object, and providing second display signals indicative of the simulated environment including the virtual object to the display.

In one embodiment, the method includes receiving the one or more input signals including a signal indicative of a tilted orientation of an input controller, and providing third display signals indicative of the simulated environment including a cross-section of the virtual object. In some embodiments, the method includes generating a plurality of virtual objects represented as polyhedral volumetric objects. In an embodiment, the virtual object is a first virtual object, and wherein the method further comprises receiving the one or more input signals including a signal indicative of one of a movement of the first virtual object and a shape alteration of the first virtual object, detecting a collision between the first virtual object and a second virtual object, and constraining the first virtual object relative to the second virtual object responsive to the collision.

In some embodiments, the method includes modeling physical interactions in the simulated environment in accordance with the laws of physics. In an embodiment, the method includes communicating a file encoding the virtual object to a three-dimensional printer. In at least one embodiment, the method includes receiving one or more input signals from a plurality of input controllers.

According to one aspect, a non-transitory computer readable medium storing sequences of computer-executable instructions for modeling architectural objects, the sequences of computer-executable instructions including instructions that instruct at least one processor to generate a three-dimensional simulated environment, provide first display signals indicative of a field of view of the simulated environment to a display screen, generate, based on one or more input signals indicative of a three-dimensional movement of the input controller, a virtual object represented as a polyhedral volumetric object, and provide second display signals indicative of the virtual object in the field of view of the simulated environment to the display screen.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE INVENTION

Figure 1:
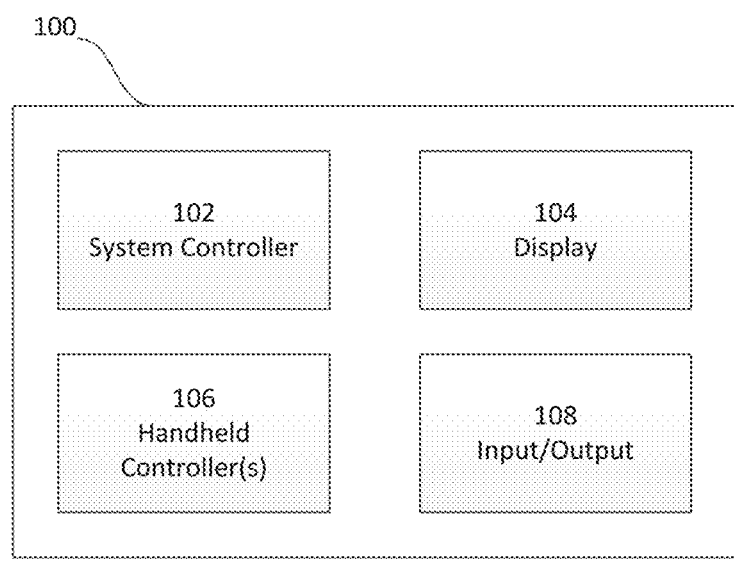
FIG. 1 illustrates a block diagram of a modeling system according to an embodiment.

Embodiments of the present disclosure are directed generally to a system for Virtual Reality (VR)/Augmented Reality (AR) modeling. More particularly, embodiments are directed to VR/AR modeling optimized for use in the architectural modeling field. As discussed above, although VR/AR technology and architectural modeling software are separately known, it may be advantageous to provide a VR/AR system (including, for example, a software application) optimized for use in an architectural modeling environment.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Conventional architectural modeling software is typically designed for use with a two-dimensional (2D) screen. For example, conventional modeling software applications include AutoCAD and Revit from Autodesk, Inc. of San Rafael, Calif., ARCHICAD from Graphisoft SE of Budapest, Hungary, and SketchUp from Trimble, Inc. of Sunnydale, Calif. Conventional modeling software is inherently limited inasmuch as it may be difficult for a designer to perceive a look-and-feel of a three-dimensional (3D) structure modeled and displayed on a 2D screen.

Some modeling applications permit designs to be exported to a VR/AR viewing system, such that a user may view a model generated from a software application in an immersive VR/AR environment. However, user interaction with the model being viewed is minimal or nonexistent. For example, if a designer wishes to edit a model, she must exit the VR/AR system, change the model on the 2D screen using the software application, generate a new file including the updated model, and re-enter the VR/AR system to view the changes to the model, which is a laborious and inefficient process. Alternatively, a different person may make changes in the modeling software on a 2D screen with the changes being viewable by the person viewing the model in VR/AR, which is also inefficient and doesn't allow the user making the edits to experience them within VR/AR.

In light of the foregoing deficiencies, a VR/AR system referred generally to as "Arkio" is provided to deliver a complete VR/AR modeling and design system. Arkio generates a simulated environment which users may interact with, such as by generating objects in the simulated environment. Arkio provides several features designed to optimize the user experience in 3D VR/AR modeling, and although certain embodiments are particularly advantageous for architectural modeling, the benefits provided by Arkio extend to any technical field involving 3D modeling.

Arkio provides at least four advantages with respect to an architectural modeling context. First, Arkio provides significant advantages compared to conventional cardboard-based, physical models and mock-ups used in the architecture industry, as well as typical modeling applications used on a 2D screen in preserving a look-and-feel of models. For example, whereas a cardboard model exists at a static model scale, Arkio provides a variable scale for users to view and modify a digital model at a human scale, a birds-eye view scale, or any scale in between. The ability to interact with the model at human-scale provides a significant advantage in allowing a user to experience the look-and-feel of a model by enabling a user to virtually "walk around" inside the model, which is not possible with a physical cardboard model. Similarly, although some conventional modeling applications provide a variable scale, the fact that the model is presented on a 2D screen imposes significant restrictions on a user's ability to experience the look-and-feel of the model. With Arkio, users can model a building as easily standing inside the virtual model as when viewing the model from the outside.

Second, Arkio provides a system which is significantly more intuitive to those who are not experienced with architectural modeling and design. For example, an inexperienced layperson may not have the knowledge necessary to understand a 2D blueprint of a planned design. In contrast, the 3D models that Arkio provides are immediately intuitive to any viewer, because the models closely approximate an actual look-and-feel of the planned structure. Arkio therefore provides an intuitive solution to reduce or eliminate miscommunications and misunderstandings between architectural designers and laypeople.

Third, designs created with Arkio may be shared via a network connection, such as the Internet, allowing any number of remote users to view and interact with the design. For example, Arkio allows multiple users connected via the Internet to modify a single model in real-time while other users simultaneously "look around" inside the model.

Finally, Arkio provides all of the foregoing features—and additional features discussed below—without compromising computational efficiency. Arkio's computationally-efficient solution is enabled, in part, by Arkio's novel approach to representing objects, as discussed in greater detail below. By minimizing computational complexity, Arkio is able to display a simulated environment at a sufficiently-high framerate and level of clarity to provide a comfortable user experience in VR/AR. Arkio is also unique in the way it enables users to alter any detail of the model being worked on at any point in time, as modeling operations are not irrevocably "baked into" models as typically happens with traditional mesh-modeling systems but instead can be revised or reverted at any time during the modeling process.

FIG. 1 illustrates a modeling system 100 according to one embodiment of the present disclosure. The modeling system 100 includes a system controller 102, a display 104, a handheld controller 106, and an input/output module 108. In some embodiments, the system controller 102 may include the input/output module 108.

The system controller 102 is generally configured to generate a simulated environment and manage interactions between a user and the simulated environment. The simulated environment refers generally to either a VR or AR environment. For example, the processor 102 may generate a simulated environment, display the simulated environment on the display 104, and modify the simulated environment according to input signals received from the handheld controller 106. The system controller 102 is discussed in greater detail below with respect to FIGS. 6 and 14.

The display 104 is generally configured to display a simulated environment. For example, the display may receive input signals from the system controller 102 to display the simulated environment generated by the system controller 102. The display 104 is discussed in greater detail below with respect to FIGS. 2, 3A, and 3B.

The handheld controller 106 is generally configured to allow a user to interact with a simulated environment. For example, the handheld controller 106 may be configured to interact with the simulated environment generated by the system controller 102. In some embodiments, the modeling system 100 may include one or more controllers in addition to the handheld controller 106, as discussed in greater detail below. The handheld controller 106 is discussed in greater detail below with respect to FIGS. 4, 5A, and 5B. In other embodiments, no controllers may be necessary. For example, user input may be managed by tracking the user's hands directly with cameras, sensors, or a combination of both.

The input/output module 108 is configured to interact with systems external to the modeling system 100. For example, the input/output module 108 may be configured to exchange information with a 2D display to display a 2D view of the simulated environment. In another example, the input/output module 108 may be configured to exchange information with an external model generator. For example, the input/output module 108 may be configured to provide model information to a 3D printer, which may print a 3D model of one or more models within a simulated environment generated by the modeling system 100. As discussed above, the system controller 102 may include the input/output module 108.

Figure 2:
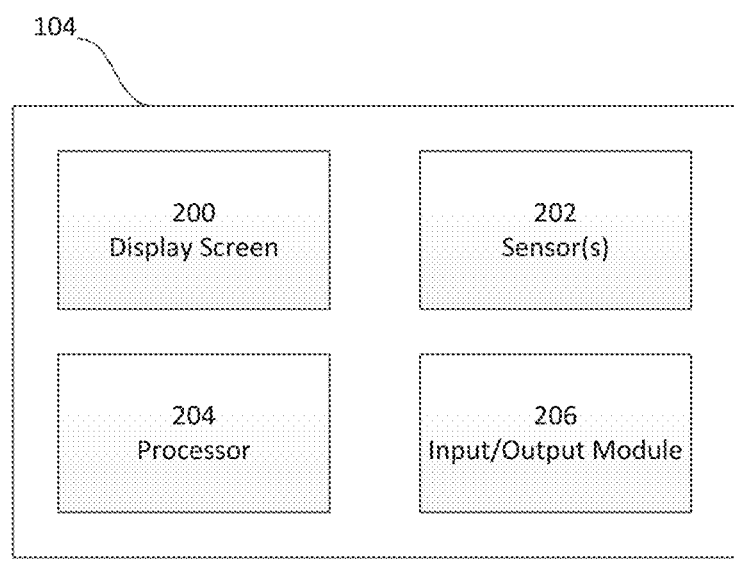
FIG. 2 illustrates a block diagram of a display.

FIG. 2 illustrates a block diagram of the display 104 according to an embodiment. The display 104 includes a display screen 200, one or more sensors 202, a processor 204, and an input/output module 206. As discussed above, in one embodiment the display 104 is configured to be worn on a user's head or face to provide visual stimuli indicative of a simulated environment.

The display screen 200 is generally configured to display a simulated environment to a user. The display screen 200 may cover a user's entire Field Of View (FOV), or a significant portion thereof, to provide a feeling of immersion within the simulated environment to the user. The display screen 200 may be configured to display images at an appropriate framerate according to signals received from the processor 204. In some cases two separate display screens are used instead of one.

For example, in one embodiment, the framerate of the display 104 is selected to prevent a user from experiencing adverse effects (for example, dizziness) occasionally associated with simulated environments operating below an appropriate framerate. In one embodiment, the framerate is maintained at approximately 90 Frames Per Second (FPS) to provide a comfortable experience for a user. In alternate embodiments, the processor 204 may dynamically determine an appropriate framerate.

The one or more sensors 202 are generally configured to sense parameters associated with the display 104. For example, the one or more sensors 202 may include an accelerometer configured to sense an orientation of the display 104, and generate feedback signals indicative of the orientation of the display 104. The signals indicative of the orientation of the display 104 may affect the user's experience in one of several ways. For example, in one embodiment, the feedback signals may allow the user to "look around" the simulated environment by altering a user's Point of View (POV) within the simulated environment analogously to the orientation of the user's head.

The processor 204 is generally configured to process signals affecting the simulated environment. For example, the processor 204 may receive the feedback signals from the one or more sensors 202 to determine an orientation and/or position of the user's head, and correspondingly alter the display on the display screen 200. Alternatively, the processor 204 may communicate the feedback signals to the system controller 102, and receive input signals from the system controller 102 to alter the display on the display screen 200.

In some embodiments, the processor 204 may be internal to the display 104 and manage the simulated environment independently, or may consist of multiple processors operating in parallel. In other embodiments, the processor 204 may be internal to the display 104 and communicate with one or more additional processing elements external to the display 104 via the input/output module 206. For example, the display 104 may be coupled to one or more external processors via a wired "tether" via the input/output module 206, or via a "tetherless" wireless connection via the input/output module 206. In still other embodiments, the display 204 may not include the processor 204 and may be controlled by one or more external processors via the input/output module 206.

Figure 3A:
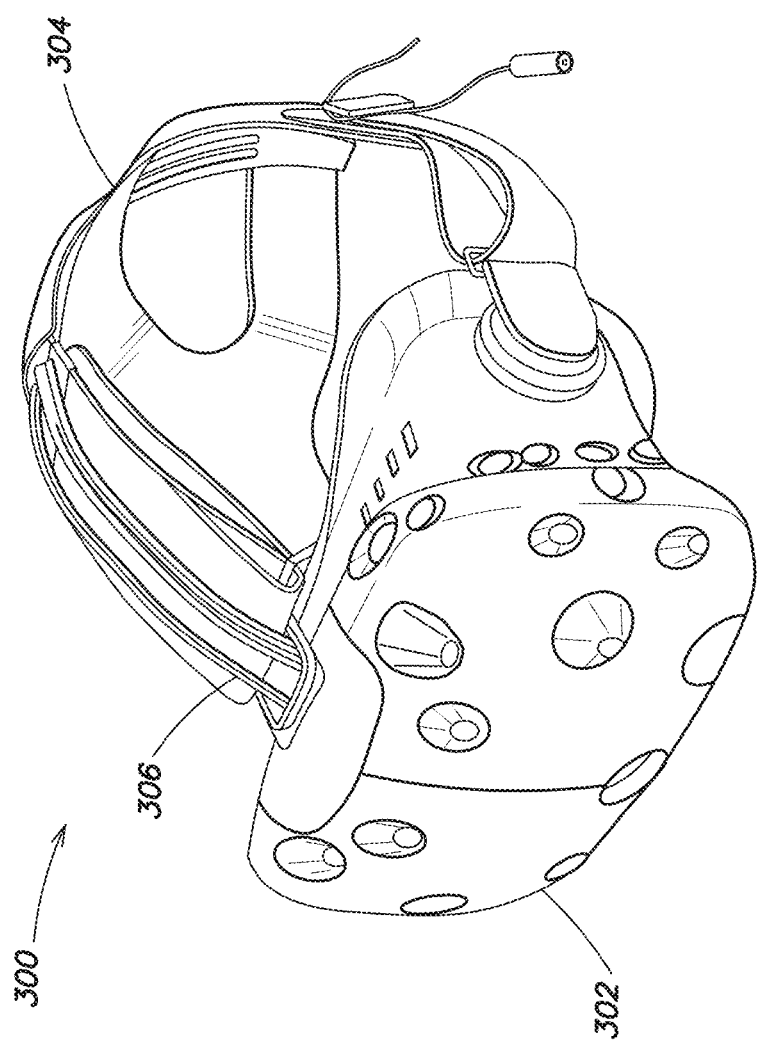
FIG. 3A illustrates a perspective view of a display headset.
Figure 3B:
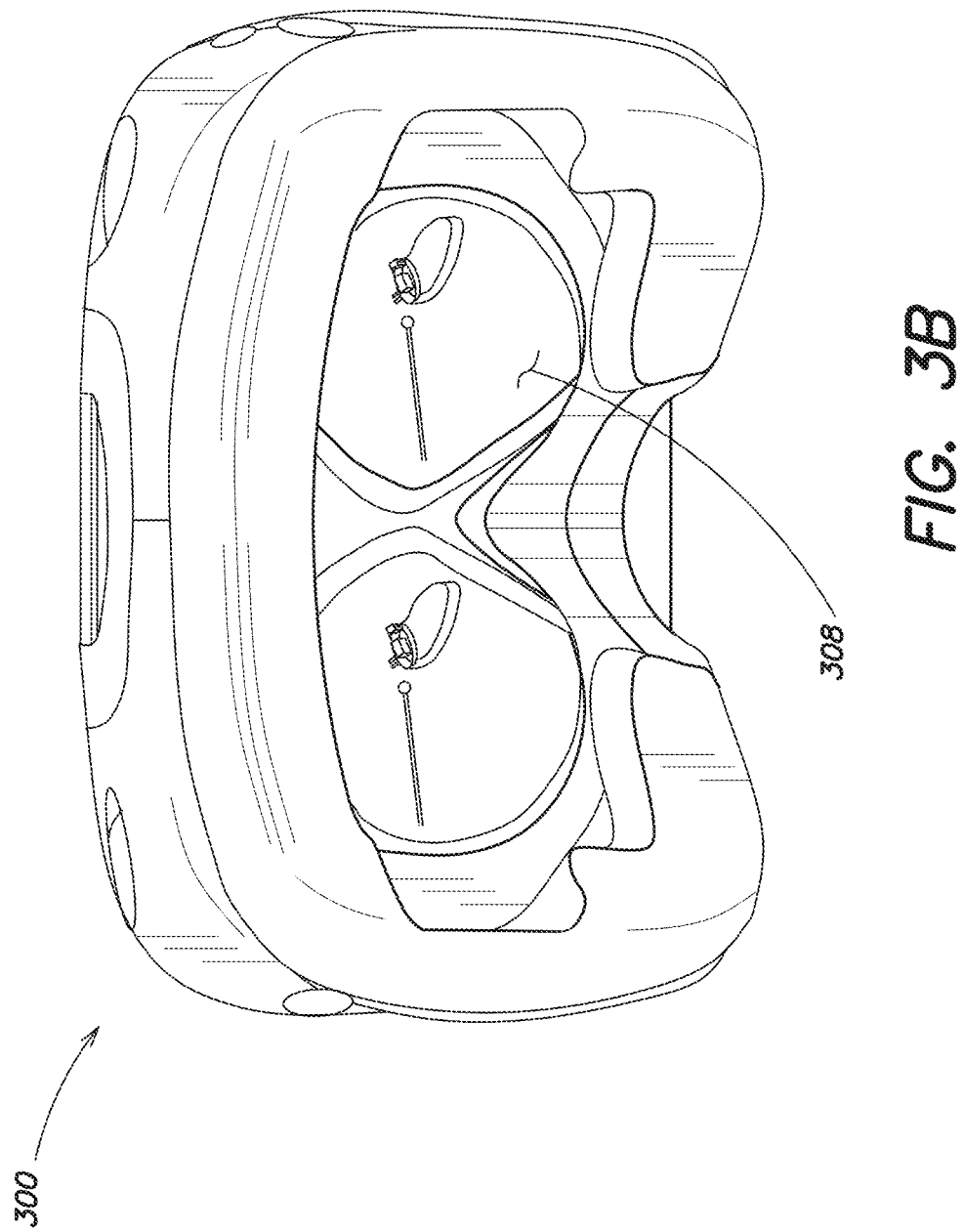
FIG. 3B illustrates a back view of the display headset.

FIG. 3A illustrates a perspective view of a headset display 300, which is an example embodiment of the display 104. The headset display 300 is the HTC Vive™ headset developed by HTC Corporation of New Taipei City, Taiwan, and Valve Corporation of Bellevue, Wash. The headset display 300 includes a main body portion 302 including a plurality of components (for example, one or more sensors, a display screen, etc.), a harness portion 304 to secure the headset display 300 to a user's head, and a wired tether portion 306 to connect the headset display 300 to one or more external systems. In other instances, a headset may be a fully stand-alone device, requiring no connection to any external computing device. FIG. 3B illustrates a back view of the headset display 300. The headset display 300 includes a display screen 308 to display a simulated environment to a user.

Figure 4:
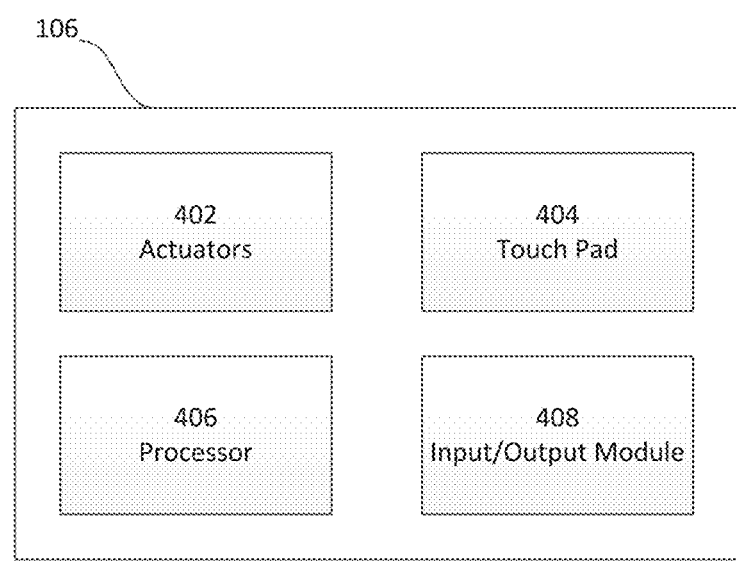
FIG. 4 illustrates a block diagram of a handheld controller.

FIG. 4 illustrates a block diagram of one embodiment of the handheld controller 106. The handheld controller 106 includes actuators 402, a touch pad 404, a processor 406, and an input/output module 408. As discussed above, the handheld controller 106 may be configured to allow a user to interface with a simulated environment. In some embodiments, the touch pad 404 may be replaced by one or more other input mechanisms. In still other embodiments, hand gestures may be sensed and translated into computer-readable signals used for interaction with a simulated environment instead of, or in addition to, a physical controller.

In one embodiment, the actuators 402 include one or more push-buttons and one or more trigger actuators. Actuation of one of the actuators 402 generates an output signal which may affect the simulated environment. For example, in one embodiment, actuation of one of the actuators 402 may display a menu of options on the display screen 200 which the user may select, as discussed in greater detail below.

The touch pad 404 may include a touch-sensitive surface configured to allow a user to "move" within the simulated environment or to interact with the simulated environment. The touch pad 404 may detect, for example, a position of a user's touch on the touch pad 404 and generate feedback signals indicative of the position of the user's touch. The feedback signals indicative of the position of the user's touch on the touch pad 404 may affect the user's experience in one of several ways. For example, in one embodiment, the feedback signals may allow the user to "move around" the simulated environment by altering a user's position within the simulated environment analogously to the user's touch on the touch pad 404. In alternate embodiments, the touch pad 404 may be replaced with a joystick or similar component.

The processor 406 is generally configured to process signals affecting the simulated environment. For example, the processor 406 may receive the feedback signals from the actuators 402 to determine whether a menu button has been actuated, and correspondingly generate output signals to cause a menu to be displayed on the display screen 200. For example, the processor 406 may communicate the display signals to the display 104 via the input/output module 408 or to one or more external processors. Alternatively, the processor 406 may communicate the output signals to the system controller 102, and the system controller 102 may communicate display signals to the display 104.

Figure 5A:
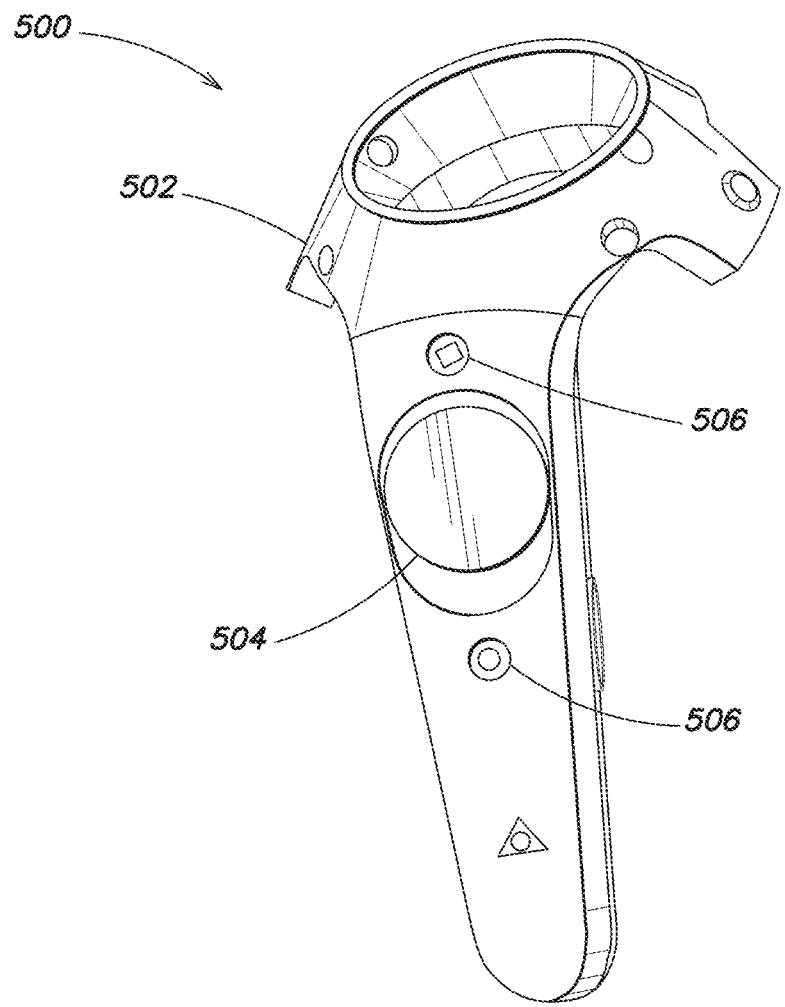
FIG. 5A illustrates a perspective view of a controller.
Figure 5B:
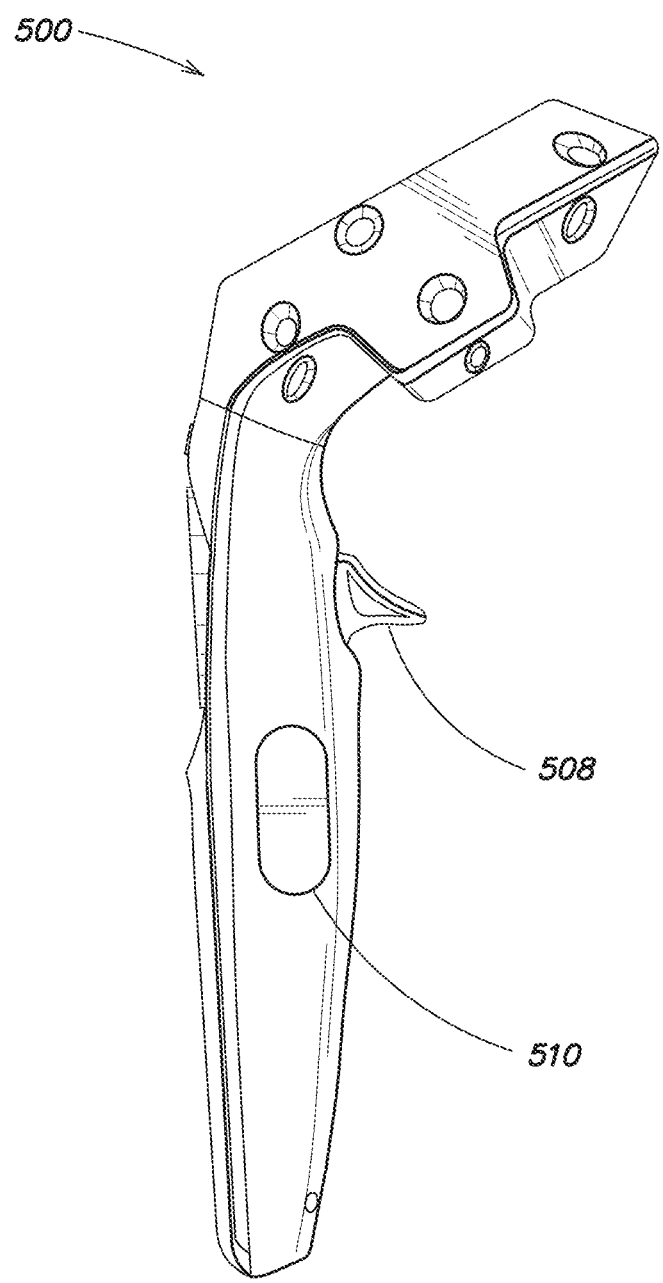
FIG. 5B illustrates a side view of the controller.

FIG. 5A illustrates a perspective view of a controller 500, which is an example embodiment of the handheld controller 106. The controller 500 is the HTC Vive™ controller developed by HTC Corporation of New Taipei City, Taiwan, and Valve Corporation of Bellevue, Wash. The controller 500 includes a main body portion 502 configured to house components of the controller 500 (for example, one or more sensors), a touch pad 504, and button actuators 506. FIG. 5B illustrates a side view of the controller 500. The controller 500 includes a trigger actuator 508, and a grip actuator 510 to detect whether a user is grasping the controller 500. In at least one embodiment, the display 104 and the handheld controller 106 enable a user to interface with a simulated environment with either three degrees of freedom (3DOF) or six degrees of freedom (6DOF).

As discussed above, the system controller 102 is generally configured to interface with the display 104, the handheld controller 106, and the input/output module 108 to generate a simulated environment and manage interactions between a user and the simulated environment. In one example, the simulated environment may be an architectural modeling environment.

Figure 7A:
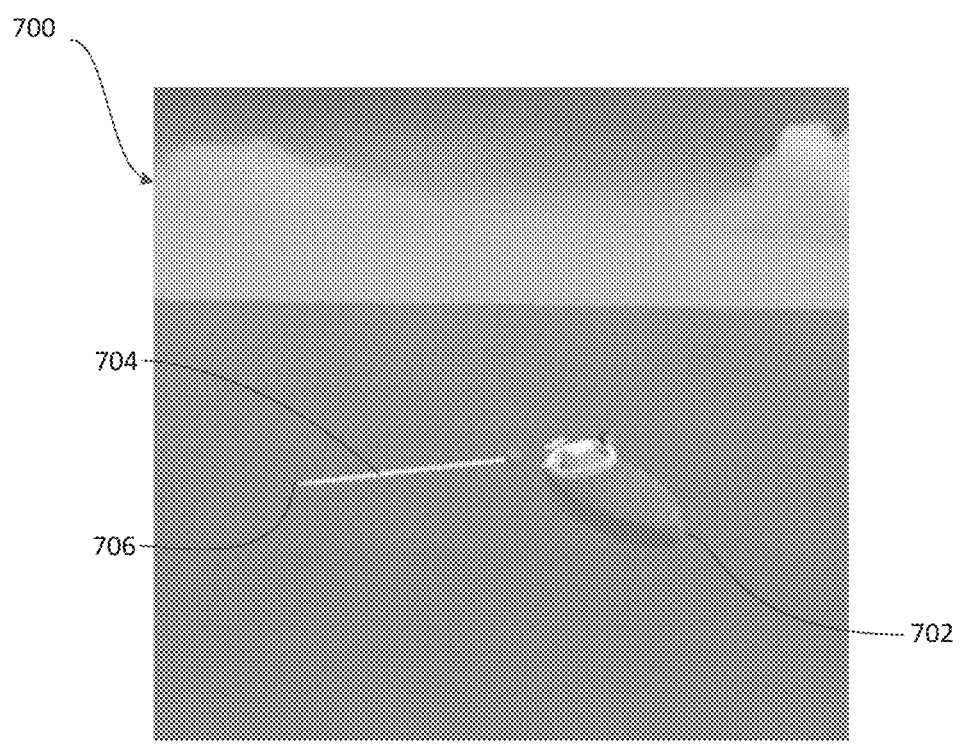
FIG. 7A illustrates a view of a simulated environment according to an embodiment.

For example, FIG. 7A illustrates a POV of a simulated environment 700. The simulated environment 700 may be generated, for example, by the modeling system 100 and displayed on the display 104. The view of the simulated environment 700 includes a virtual controller 702 and a laser 704 emanating from the virtual controller 702 to a terminal point 706. The virtual controller 702 is a virtual representation of a controller, such as the handheld controller 106. The laser 704 is a virtual indication of where the virtual controller 702 is pointed. In the illustrated embodiment, the laser 704 is pointed at a terminal point 706.

When a user moves the handheld controller 106, the virtual controller 702 will move in an analogous manner. Accordingly, although reference may be made to movement of either the handheld controller 106 or the virtual controller 702, it is to be appreciated that the movement of the virtual controller 702 tracks the movement of the handheld controller 106.

In accordance with one embodiment, the system controller 102 in combination with the display 104, the handheld controller 106, and the input/output module 108 may provide a plurality of features to allow a user to interact with a simulated environment, such as the simulated environment 700.

Figure 6:
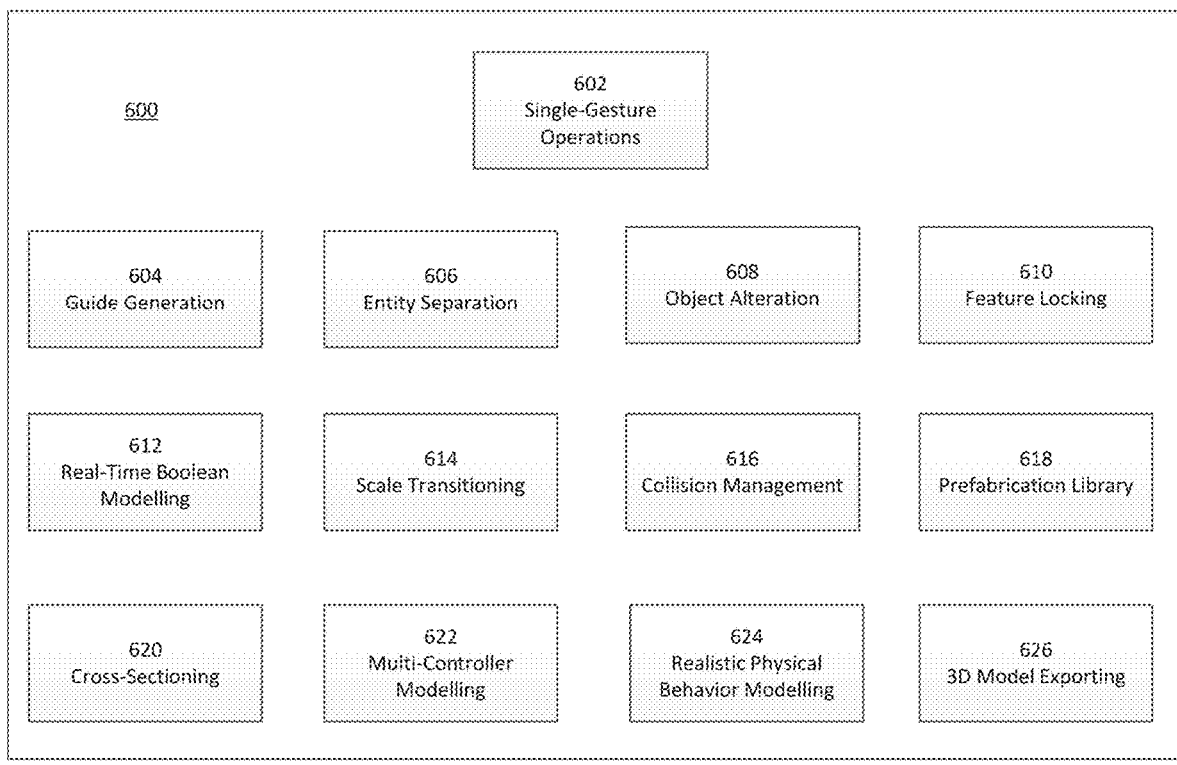
FIG. 6 illustrates a block diagram of modeling system features according to an embodiment.

FIG. 6 illustrates a block diagram of several features 600 provided by modeling system 100 according to an embodiment. The features 600 include a single-gesture operations feature 602, a guide generation feature 604, an entity separation feature 606, an object alteration feature 608, a feature locking feature 610, a real-time Boolean modeling feature 612, a scale transitioning feature 614, a collision management feature 616, a prefabrication library feature 618, a cross-sectioning feature 620, a multi-controller modeling feature 622, a realistic physical behavior modeling feature 624, and a 3D model exporting feature 626.

The single-gesture operations feature 602 will now be discussed in greater detail. Generally speaking, the single-gesture operations feature 602 allows a user to create and edit 3D objects with a single gesture using the handheld controller 106. For example, to create a rectangular prism, a user can select a first 3D point in the simulated environment 700 as a first vertex of the rectangular prism with the handheld controller 106, and "drag" the rectangular prism to a desired 3D space location in a single gesture, where the final position of the handheld controller 106 corresponds to a second, diagonally-opposing vertex of the rectangular prism.

For example, and with reference to FIG. 7A, the virtual controller 702 is pointed at a terminal point 706 in the simulated environment 700. The user may select the terminal point 706 as a first vertex of a rectangular prism by actuating one of the actuators 402, such as by depressing a trigger actuator on the handheld controller 106.

Figure 7B:
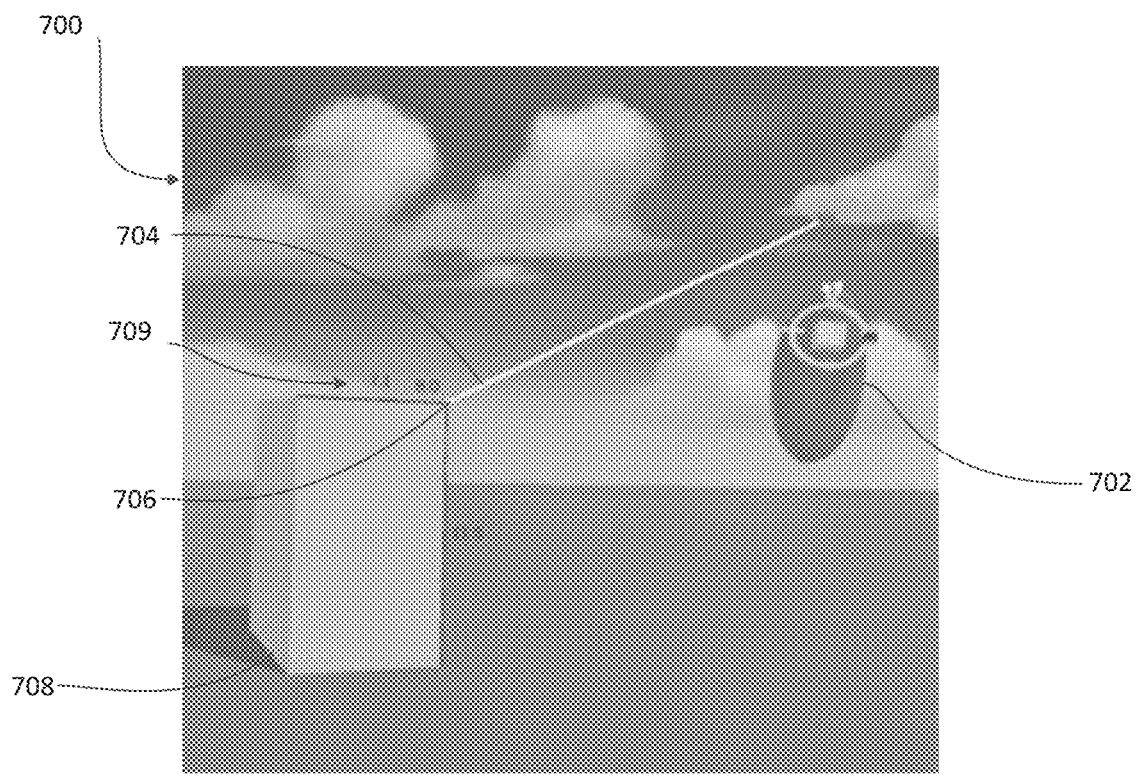
FIG. 7B illustrates a view of the simulated environment according to an embodiment.

With reference to FIG. 7B, the user moves the handheld controller 106 to drag the terminal point 706 corresponding to a second vertex of the rectangular prism. When a desired shape of the rectangular prism is reached, the user may release the trigger actuator to ultimately generate a rectangular prism 708 in the simulated environment 700. The rectangular prism 708 may displayed with dimensions 709 to indicate the length, width, and thickness of the rectangular prism 708. As discussed in greater detail below, the rectangular prism 708 may be hollow in some embodiments.

Objects such as rectangular prisms may therefore be easily generated using a single gesture (i.e., a single gesture of moving the handheld controller 106). In some embodiments, the momentum with which the handheld controller 106 is moved may affect the generated shape. For example, if the user is rapidly moving the handheld controller 106 with a significant momentum when the trigger actuator is released, the shape may continue growing with the same momentum. Conversely, if the user is holding the handheld controller 106 at an approximately stationary position with a negligible momentum when the trigger actuator is released, the shape may be finalized without expanding further.

Although the foregoing discussion involves the creation of a rectangular prism, a user may generate any convex volume in the simulated environment 700. For example, the user may create spheres, hexahedrons, pentahedral prisms, and so forth. To select a shape type, the user may actuate one of the actuators 402 to open a shape selection menu, and select a desired shape to create.

Furthermore, as discussed above, objects such as the rectangular prism 708 may be hollow in some embodiments. An object may be considered hollow where the object includes at least one internal cavity. In alternate embodiments, solid objects may also be generated, or hollow objects having several walls with different thicknesses. In some embodiments, a user may select a wall thickness for newly-generated objects, or may set a default, "normal" wall thickness for newly-generated objects. For example, the user may select a normal wall thickness to comply with a minimum wall thickness required by applicable building codes.

In alternate embodiments, the modeling system 100 may dynamically determine a wall thickness. If the modeling system 100 determines that a wall is a normal wall subject to ordinary building code restrictions, then a default wall thickness may be automatically applied consistent with relevant building codes. Alternatively, the modeling system 100 may determine that a wall abutting a garage on a first side and a residential living space on a second side must be thicker than a normal wall to satisfy fire code regulations.

The single-gesture operations feature 602 also allows a user to generate derivative objects based on previously-generated objects. For example, the user may have generated a convex object, and subsequently desires to generate one or more holes through, or extrusions from, one or more surfaces of the convex object.

Figure 8:
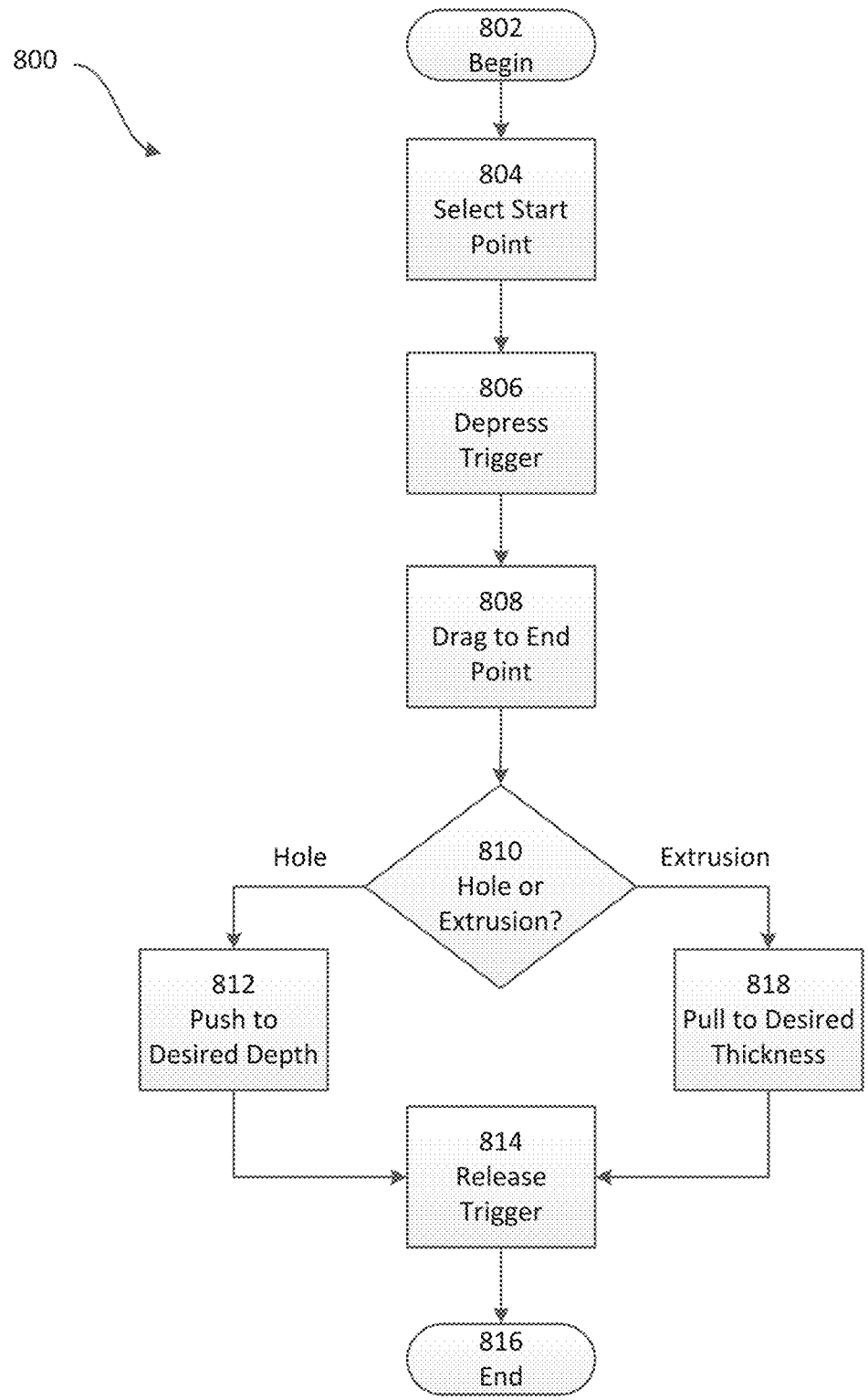
FIG. 8 illustrates a process of generating a derivative object according to an embodiment.

FIG. 8 illustrates a process 800 of generating a derivative object based on a previously-generated object according to an embodiment. At act 802, the process 800 begins. At act 804, a user points a controller at a desired starting point for the derivative object on a surface of the previously-generated object. At act 806, the user depresses a trigger actuator on the controller to begin forming the derivative object.

At act 808, the user drags the controller to a desired ending point for the derivative object. At act 810, a determination is made as to whether the user desires to create a hole through the previously-generated object, or if the user desires to create an extrusion from the previously-generated object. A hole may extend partially or fully through the previously-generated object, and the extrusion may extend any distance from the previously-generated object.

If the user desires to generate a hole through the previously-generated object, then the process 800 continues from act 810 to act 812. At act 812, the user "pushes" inwards into the surface of the previously-generated object to a desired depth, and the process 800 continues to act 814. At act 814, the user releases the trigger actuator to finalize the generation of the derivative object. At act 816, the process 800 ends.

If the user desires to generate an extrusion from the previously-generated object at act 810, then the process 800 continues from act 810 to act 818. At act 818, the user "pulls" outwards from the surface of the previously-generated object to a desired extrusion thickness, and the process 800 continues to act 814. At act 814, the user releases the trigger actuator to finalize the generation of the derivative object. At act 816, the process 800 ends.

Figure 7C:
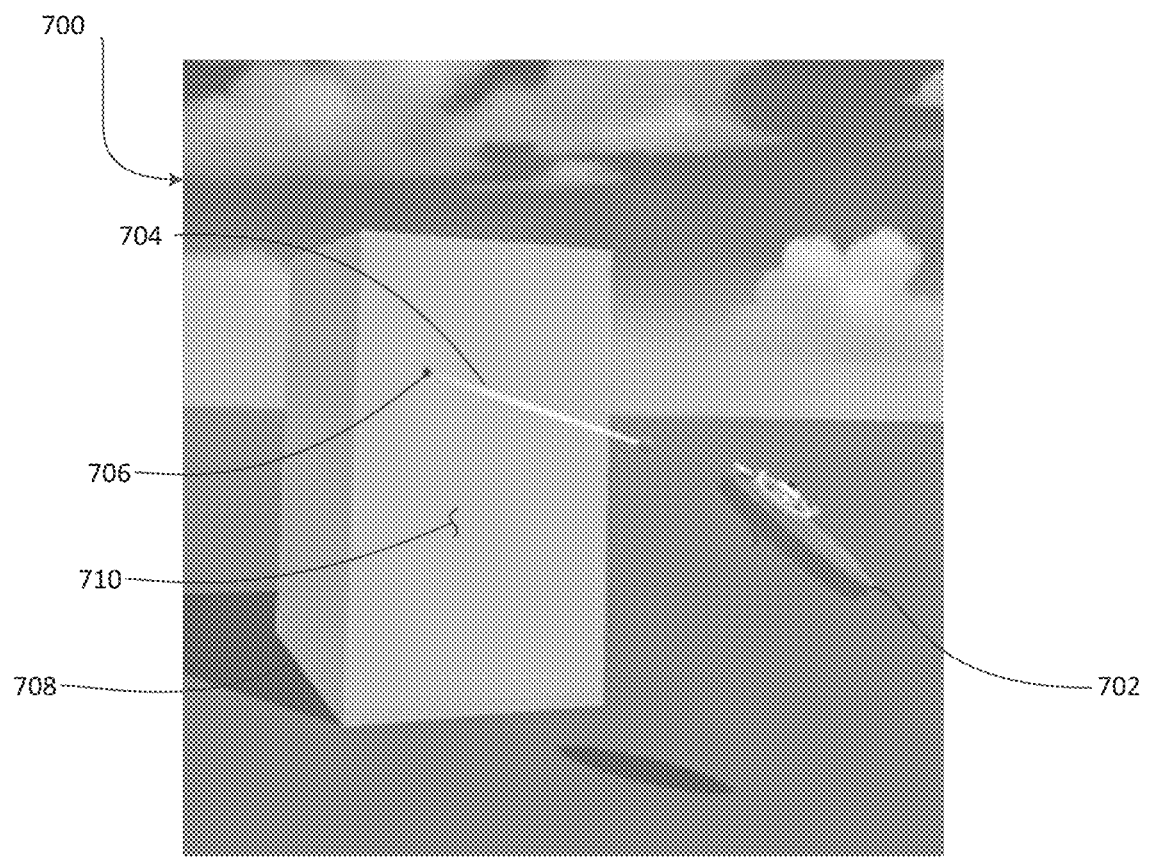
FIG. 7C illustrates a view of the simulated environment according to an embodiment.

An example of the process 800 will now be illustrated with respect to FIG. 7C. Continuing with the examples illustrated in FIGS. 7A and 7B, FIG. 7C illustrates an embodiment in which a user has generated the rectangular prism 708, and desires to create a derivative rectangular hole completely through a surface 710 of the rectangular prism 708. For example, the rectangular prism 708 may be representative of a rudimentary building, and the hole may be representative of a window in the building.

At act 802, the process 800 begins. At act 804, the user begins by pointing the terminal point 706 of the laser 704 at a desired starting point of the desired object. For example, the starting point may represent a first corner of the rectangular hole. At act 806, the user depresses a trigger actuator to initialize the creation of the hole. At act 808, the user moves the handheld controller 106 to drag the terminal point 706 to a desired end point. For example, the desired end point may represent a second corner of the rectangular hole, diagonally-opposite the first corner.

When a desired shape of the rectangular hole is reached, a determination is made at act 810 as to whether a hole or extrusion is desired. As discussed above, in the present example, the user desired to create a hole. Accordingly, at act 812, the user may push the handheld controller 106 inwards into the surface 710 of the rectangular prism 708 to a desired depth. Stated differently, the user may move the handheld controller 106 such that the corresponding movement of the virtual controller 702 is directed inwards into the rectangular prism 708.

The degree to which the user pushes inwards corresponds to the depth of the rectangular hole, where the hole may extend partially or fully through the surface 710 of the rectangular prism 708. When the user is satisfied with the depth of the rectangular hole, the process 800 continues to act 814. At act 814, the user releases the trigger actuator to finalize the generation of the rectangular hole in the surface 710 of the rectangular prism 708. At act 816, the process 800 ends.

Figure 7D:
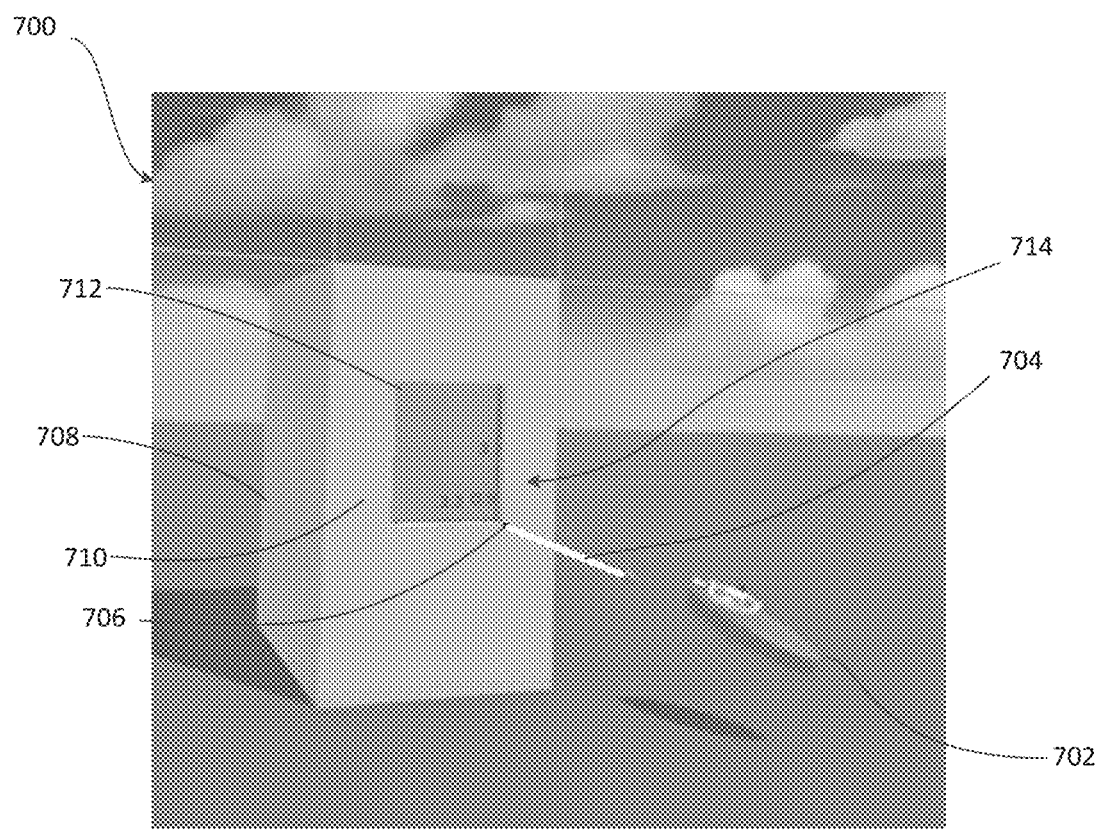
FIG. 7D illustrates a view of the simulated environment according to an embodiment.

FIG. 7D illustrates the rectangular prism 708 with a rectangular hole 712 generated through the surface 710 according to execution of the process 800. As illustrated by FIG. 7D, the rectangular prism 708 is a hollow shape (i.e., the walls of the rectangular prism 708 have a finite thickness) and the rectangular hole 712 extends entirely through the surface 710. The rectangular hole 712 may be displayed with dimensions 714 to illustrate the length, width, and depth of the rectangular hole 712.

It is to be appreciated that, although the foregoing example is directed to a hole extending entirely through a surface of a previously-generated object, alternate derivative objects are possible. For example, a user may generate an "alcove" in a wall surface of the previously-generated object by pushing inwards into the surface of the previously-generated object at a depth that is less than the thickness of the wall. Alternatively, the user may generate an extrusion from the surface of the previously-generated object by pulling outwards from the surface of the previously-generated object.

With respect to creating holes in or through hollow shapes, the system can determine when the user has extended a hole all the way into the hollow shape inside, and, should the user continue to push the hole forward, the modeling system 100 may alter the modeling operation in such a way as to create a shell around the hole being created inside the first hollow shape. The result of this operation is the ability to do real-time shape forming of hollow shapes as if they were solids, not shells, since in principle the user should not need to decide whether she is working with solids or shells as in typical modeling software.

Furthermore, although the foregoing example describes a rectangular hole, it is to be appreciated that alternate shapes are possible. For example, a user may generate a circular hole or extrusion, a triangular hole or extrusion, and so forth. In some embodiments, the actuators 402 include a menu button which, when actuated by a user, displays a menu via the display 104 from which a user may select a desired shape of the derivative object.

The guide generation feature 604 will now be discussed in greater detail. In certain modeling systems, users may find that unrestrained freedom to create models is not advantageous. For example, if a user is given unrestrained and unguided freedom to draw any rectangle, it may be very difficult to model a window which is substantially identical in size and vertical offset to an adjacent window. Accordingly, the modeling system 100 provides feature guides to assist users by providing guides.

In a first, suppose a user creates a window in a building model, and desires to create additional windows adjacent to the first window. After creating the first window, guide lines indicative of the borders of the window may appear and extend from the first window. For example, a horizontal line may extend from the top boundary of the window such that the user knows to begin generating an adjacent window at the same height.

In a second example, a user desires to create a cube having six identical planar surfaces. As the user begins to generate the cube, the modeling system 100 may detect that the user is attempting to generate a cube, and automatically "snap" the shape to a cube. For example, as the user draws the cube, the modeling system 100 may detect that the length, width, and thickness of the shape do not deviate by more than a threshold amount of 10% from one another, determine therefrom that the user desires to draw a cube, and automatically snap the shape to a cube. In alternate examples, where the user is utilizing a controller such as the handheld controller 106, the user may actuate one of the actuators 402 to indicate that a drawn shape should automatically snap to a cubic shape.

It is to be appreciated that the guide generation feature 604 allows any kind and number of guides may be generated to assist a user. Users may activate some, all, or none of the guides. Furthermore, the user may configure guides as desired and create temporary guides from any feature of any shape. For example, where a rectangular hole will snap to a square if the length is within a threshold amount from the width, the user may configure the threshold amount.

In Arkio, shapes may be designed to have a size and shape relative to other shapes, either automatically or under explicit user control. As an example, creating a new shape on an edge guide from a previously-generated shape may result in the new shape moving with the previously-generated shape when the previously-generated shape is edited or moved around. These types of dependencies may also be visualized using distance markers between shapes or features of shapes in the model. An example is a window that is designed to always be at a set offset from the edge of the wall that the window is in. The modeling system 100 helps the user to visualize this dependency as a "locked" distance between the two features of these two shapes. The user is able to "unlock" the distance so that the edge of the wall moves independently from the window. These types of dependencies may be created by the user between shapes at any arbitrary distance from each other. One example of such an operation is to lock together the roofs of two buildings, so that altering the height of one also alters the height of the other. The same method can be applied to other modeling operations, such as skewing faces of buildings or tilting their sides in the same way.

The entity separation feature 606 will now be discussed in greater detail. Generally speaking, the entity separation feature 606 enables a more user-friendly and computationally-efficient solution by representing objects as separate entities. In certain conventional modeling systems, models are represented in a single collective "mesh" of triangles and polygons. When a change in made to a model—such as the addition of a window to a modeled building—the change is permanently "baked into" the mesh, such that the change is not perceived as a separate entity. Instead, the change is perceived as a modification to the single collective mesh of triangles and polygons, and therefore has no separate entity status. Subsequent revision of the change may therefore be difficult, because the user can only operate on the single static mesh.

In one embodiment, each of the objects in a 3D model is represented as a separate volumetric 3D entity. More specifically, objects are represented as convex 3D polyhedral cells that are connected together along shared boundary planes and faces. For example, the rectangular prism 708 and the rectangular hole 712 discussed above with respect to FIG. 7C are separate entities connected together along shared boundary planes. All models in the system have surface boundaries which are non-self-intersecting oriented manifolds, such that all 3D objects have well-defined inside and outside regions. Some embodiments of the modeling system 100 therefore provide a convex cellular network structure that can be updated dynamically and/or incrementally in real-time under geometric editing operations.

In addition to storing information about the connectivity of cells at cell boundaries, the modeling system 100 keeps track of the spatial containment and nesting of internal cells within the confines of other, external cells. For every internal solid and/or hole cell, the modeling system 100 keeps track of the smallest set of external hole and/or solid cells that spatially contain the internal cell. For example, a hole representing a room stores a list of all the cells contained fully or partially in the room, such as cells representing furniture or internal divisions or features of the room.

This containment information is continuously kept up to date as cells are modified through user editing operations. For example, if a first cell is enlarged through a user editing operation so that the first cell's shape extends beyond the first cell's original containing cell and into a neighboring cell then the system automatically records the fact that the first cell is now contained by two cells instead of one. It is to be appreciated that the foregoing references to "internal" and "external" cells are for explanatory purposes only. Cells may be simultaneously considered internal and external. No tangible constraint regarding internal cells as compared to external cells is meant to be implied by the foregoing discussion.

Cells may also be assigned certain categories or attributes (e.g., as residential or commercial housing cells) which can then aid the user in understanding the overall area size of buildings of a certain category. This information can be efficiently calculated, updated, and viewed as one or more users make edits to the model.

Representing 3D models as collections of convex 3D polyhedral cells satisfies at least three objectives, with the ultimate effect being an enhanced user experience with reduced computational complexity as compared to conventional approaches. First, the collection of cells is representative of a record of dynamic 3D objects which is easily scaled to account for additional objects. Because newly-generated objects are not "baked in" to a static mesh, modifying objects retroactively is significantly simpler than in conventional approaches which utilize static meshes. Some embodiments of the present disclosure represent cells in a heavily-structured geometric representation including a graph of connected and/or nested volumetric cells, such that modifications to previously-generated cells may be executed with respect to those cells in isolation, and not with respect to an entire static mesh.

Second, the collection of cells provides an acceleration data structure for spatial intersection queries over volumetric objects which is required to maintain appropriately-high frame rates as the number of objects comprising a digital model grows large. Finally, the collection of cells is representative of an acceleration data structure for shape or line segment (raycasting) spatial overlap queries. For example, consider a modeled object which contains several internal objects. If the modeled object containing the internal objects can be ruled out as a query match then all of the internal objects may automatically be ruled out as query matches as a result, obviating the need to process the internal objects while still yielding a correct query result. The system can therefore answer most spatial queries while processing only a small fraction of the cells in a model, increasing computational efficiency for many other features such as the collision detection for physical simulation and "bashing," as described in greater detail below with respect to the collision management feature 616.

For example, some conventional systems represent models with unstructured 3D polygon meshes. Because of the unified structure, if a single polygon in the mesh is altered, the system rendering the mesh must repeat the rendering process of the entire mesh. In Computational efficiency may be improved by, for example, distinguishing between levels of detail of separate entities. For example, suppose a user POV includes several objects which are "close" and several objects which are "far." Because the modeling system 100 may render the separate objects independently, the modeling system 100 may reduce the level of detail of the far objects by omitting the visual display of objects representing smaller details of the far objects while maintaining a high level of detail of the close objects.

Computational efficiency may also be improved by, for example, loading a large model from persistent storage incrementally as needed, as opposed to loading the entire model at the beginning of a user editing session. For example, the loading of the interior contained cells of a cell representing a building may be deferred until the time when the building is displayed at a sufficient level of detail for the interior cells to be potentially visible. The loading may be deferred indefinitely for that subset of cells which is not displayed at all during a session.

The foregoing may be particularly advantageous when utilizing the modeling system 100 in a collaborative setting over a network since participants can begin viewing and editing a model without downloading the entire model over the network. Furthermore, a participant needs only receive information about changes to that subset of cells that the participant has downloaded and/or is currently viewing, significantly reducing the amount of network bandwidth needed by each participant and the overall system.

Computational efficiency may also be improved by using the nested cell containment structure as the basis for dividing computational work across multiple CPUs. Since the modeling system 100 has information about when a pair of cells—and by implication, the cells' respective contained cells—do not overlap spatially, the modeling system 100 may in some cases assign two separate CPUs to work in tandem on the parts of an editing operation affecting the two cells, reducing the overall time needed to complete the operation.

Computational efficiency can also be improved by using the inter-cell visibility and nested containment to speed up the simulation of the propagation of light through a simulated 3D environment. Many well-known methods for generation of realistic renderings of simulated environments estimate the flow of light by computing the paths of simulated rays of light passing between light sources in the scene and the scene observer's POV. This includes methods such as raytracing, path tracing, ambient occlusion, and radiosity. To capture the realistic interplay of lights and shadows as light bounces off multiple objects in a scene, tens or hundreds of millions of such rays must be traced through the scene. Computing the intersections of rays with the simulated environment as quickly as possible therefore becomes very important.

The information about inter-cell visibility afforded by the modelling system 100 can be used to accelerate such computations. For example, if a ray is traced from within a location inside a first cell to a location on the first cell's boundary and the ray does not hit a portal connecting the first cell to a second, neighboring cell, then computation of the ray's path continues inside the first cell without the need for traversing any other cells. Conversely, if a ray does hit such a portal then the computation of the ray's path continues in the second, neighboring cell alone, without the need for traversing any other cells.

In one embodiment, as a ray is traced through a cell it is only necessary to test the ray against that cell and any interior cells contained within the cell. It is not necessary to test the ray against cells contained by an interior cell unless the ray is first determined to intersect that interior cell. In conventional systems representing objects in a static triangle mesh, ray tracing is accelerated by performing computationally-complex processing operations on the static triangle mesh to build static data structures, such as kd-trees or hierarchies of nested bounding-boxes from the triangle data. In addition to consuming significant computer resources, the results of this conventional approach must be stored into files that must be loaded at run-time into the system rendering the geometry used for ray tracing. Furthermore, that process must be repeated each time a change is made to the original model, necessitating significant time and manual labor.

In contrast, because the modelling system 100 maintains information indicative of spatial relationships and portals between the separate and distinct objects, the modelling system 100 may quickly and easily perform a culling operation to determine which objects are occluded. Furthermore, since the modeling system 100 continually updates its information about object spatial relationships as the model is modified by user editing operations, the modeling system 100 can continue to accelerate ray tracing operations without the need for offline re-computation and re-loading of information.

It is to be appreciated that the entity separation feature 606 enables the modeling system 100 to be computationally-efficient, while enhancing user experience by allowing simple manipulation of previously-generated shapes. Furthermore, because each modeled object is stored as a discrete and dynamic entity, individual objects may be dynamically assigned custom rules for how the object's final shape is derived by the system. This enables, for example, dynamic procedural generation of new objects based on the shape, location, and other parameters of other objects, including previously-procedurally-generated objects.

Features of interest in an architectural modeling system which may be procedurally generated may include, for example, stairs, curved surfaces (for example, ruled surfaces, Bezier patches, and conic sections), vegetation (for example, grass, trees, and shrubbery), and natural or artificial textures and patterns (for example, brick walls, stones, rocks, and wood grains). Procedurally-generated features may be generated in real time from within the simulated environment, or off-line from outside of the simulated environment.

The ability to distinguish between objects allows, for example, a wood grain pattern to be procedurally generated on a first object while procedurally generating a brick wall pattern on a second object without any "overlap" of patterns between the objects. Procedural generation in static mesh-based modeling systems, though possible in off-line systems with specialized tools, is significantly more computationally inefficient as compared to procedural generation provided by the polyhedral cell-based modeling system 100. The specialized tools designed for static mesh-based systems must pre-compute all the procedural geometry detail, store the detail in files, and load the files into the system rendering the procedural geometry.

Furthermore, that process must be repeated each time a change is made to the original model, necessitating significant time and manual labor. The modeling system 100 by contrast can defer the procedural generation of the detail cells of a cell until the time at which the cell is at such a level of detail that the detail is potentially visible. Furthermore, since the custom rules for the procedural generation are executed in real-time within the simulated environment they can respond to changes in other cells by re-evaluating the procedural generation rules as to adjust to and take such changes into account.

The entity separation feature 606 also allows the modeling system 100 to implement efficient visual culling of occluded geometric features in real-time, without the need to pre-compute static information about potential ways for culling occluded geometry. Occluded geometric features are geometric features which are not visible to a viewer from a specific POV. For example, the occluded feature may be "hidden" behind other objects in a simulated environment. Because the occluded feature is not visible to a user, it may be advantageous to increase computational efficiency by not rendering the occluded feature. Culling refers generally to the determination of which features are occluded, such that rendering of those features may be avoided.

For example, consider an object representative of a building having several windows and doors. The building object(s) contains a variety of objects including, for example, objects representative of stairs, desks, chairs, and so forth. However, if a user is viewing the building from the outside of the building, the objects contained inside of the building may only be visible through portals on the building such as windows and doors. The objects contained inside of the building should therefore only be rendered if directly visible through one or a series of such portals. The system is able to dynamically infer the shape and location of portals by utilizing information about the connections of hole cells with their containing solid cells in their shared cell faces.

In conventional systems representing objects in a static triangle mesh, occlusion culling may only be possible by performing extremely computationally-complex processing operations on the static triangle mesh. In addition to consuming significant computer resources, the results of this conventional approach must be stored into files that must be loaded at run-time into the system rendering the potentially occluded geometry. Furthermore, that process must be repeated each time a change is made to the original model, necessitating significant time and manual labor.

In contrast, because the modeling system 100 has access to information indicative of spatial relationships and portals between the separate and distinct objects, the modeling system 100 may quickly and easily perform a culling operation to determine which objects are occluded. For example, the modeling system 100 may analyze a user POV with respect to the windows and doors to determine which objects in the building, if any, do not need to be rendered because they are occluded. Accordingly, culling may be executed by the modeling system 100 with minimal computational complexity and without consuming significant computational resources. Furthermore, since the modeling system 100 continually updates its information about object spatial relationships as the model is modified by user editing operations, the modeling system 100 can continue to perform culling operations without the need for offline re-computation and re-loading of culling information.

The object alteration feature 608 will now be discussed in greater detail. Generally speaking, the object alteration feature 608 refers to the modeling system's 100 ability to intuitively adapt an inter-connected group of objects in response to a change to one of the objects. Although the modeling system 100 offers users significant freedom to create and modify modeled objects, it may be advantageous for the modeling system 100 to be able to intuitively adapt to those creations and modifications.

Figure 9:
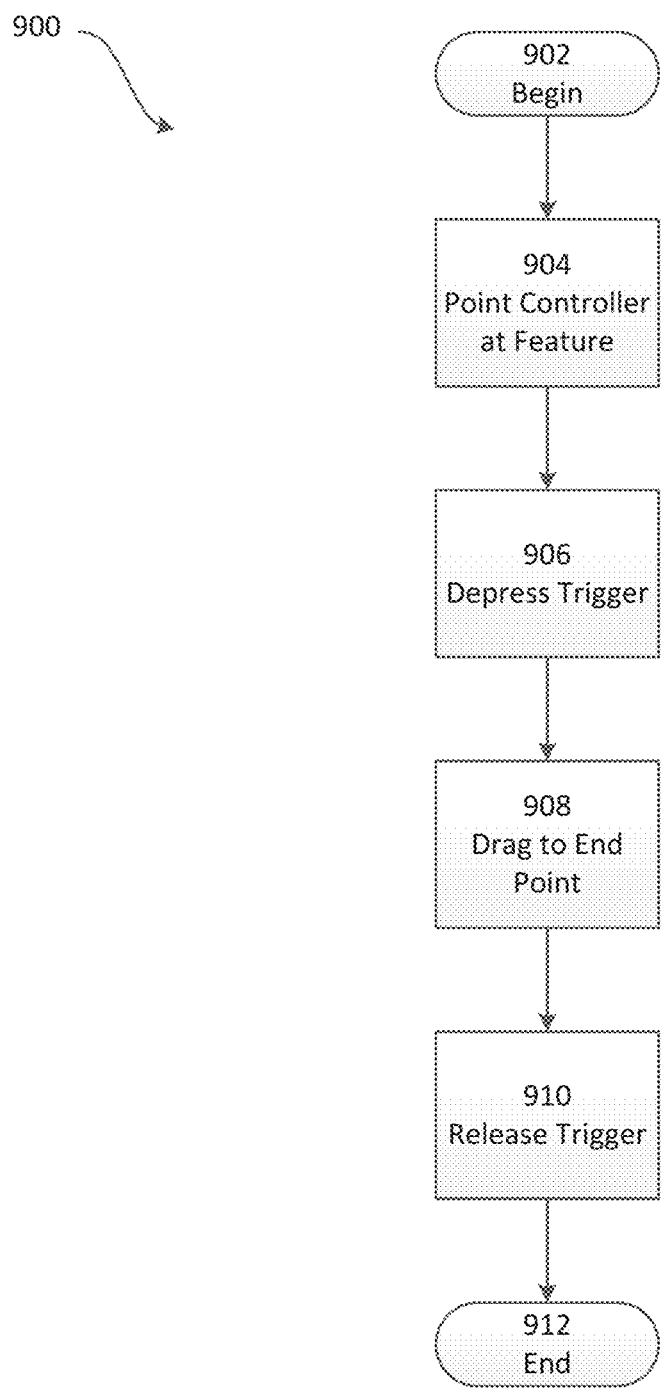
FIG. 9 illustrates a process of altering an object according to an embodiment.

FIG. 9 illustrates a process 900 of modifying a previously-generated object according to an embodiment. At act 902, the process 900 begins. At act 904, a user points a controller at a desired feature of the previously-generated object (for example, an edge of the previously-generated object) to begin modifying the previously-generated object. At act 906, the user depresses a trigger actuator on the controller to select the feature.

At act 908, the user drags the controller to a desired ending point for the selected feature of the modified object. For example, the user may push the controller inwards towards the inside of the previously-generated object to compress the object, or may pull the controller outwards away from the inside of the previously-generated object to stretch the object. At act 910, the user releases the trigger actuator to finalize the modification of the previously-generated object. At act 912, the process 900 ends.

Figure 7E:
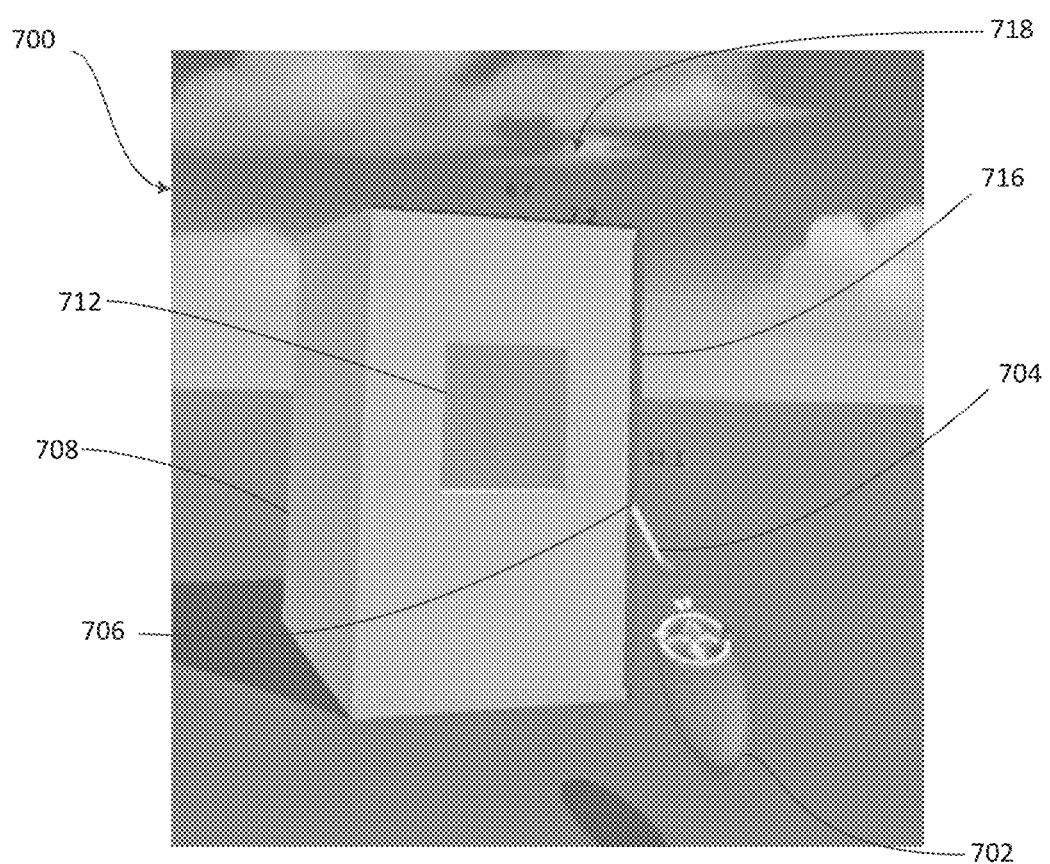
FIG. 7E illustrates a view of the simulated environment according to an embodiment.

An example of the process 900 will now be illustrated with respect to FIG. 7E. Continuing with the examples illustrated in FIGS. 7C and 7D, FIG. 7E illustrates the rectangular prism 708 which has been modified to include the rectangular hole 712. The rectangular prism 708 includes a first edge 716, and the user desires to stretch the rectangular prism 708 in a direction perpendicular to the axis of the first edge 716. FIG. 7E also includes dimensions 718 displayed as a guide.

Figure 7F:
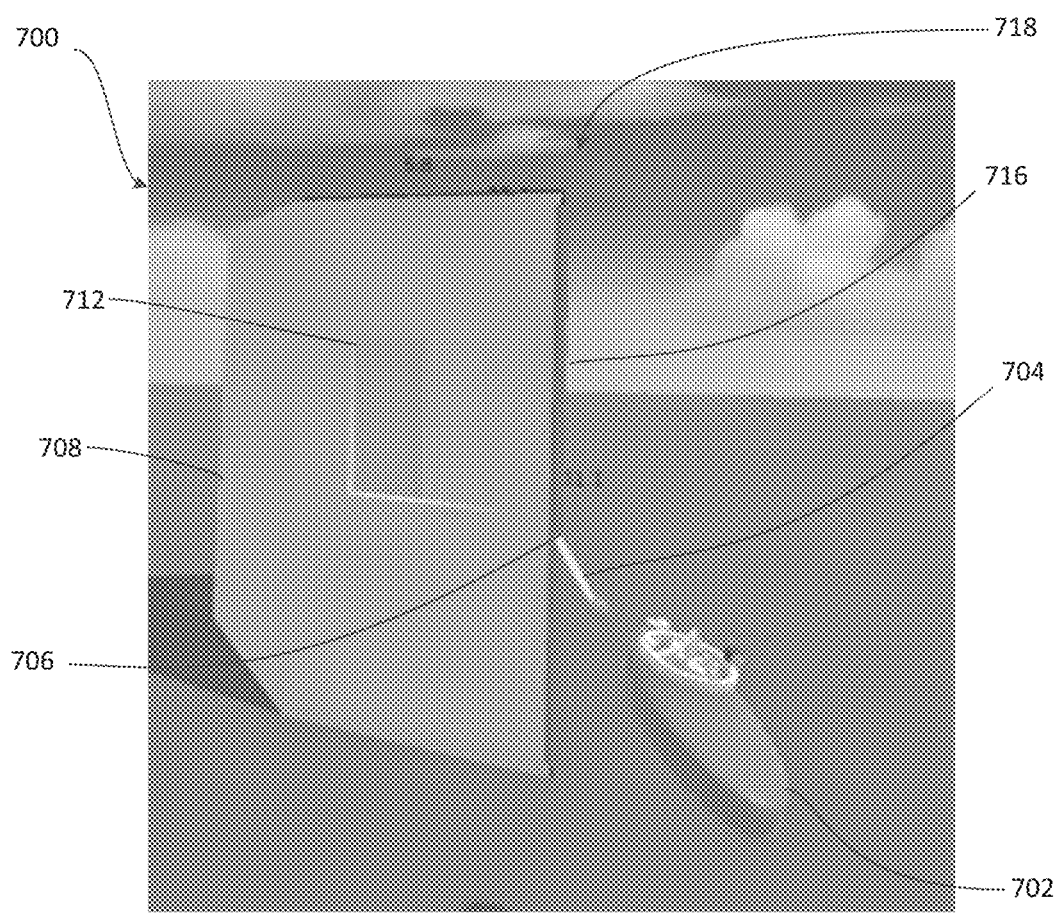
FIG. 7F illustrates a view of the simulated environment according to an embodiment.

At act 902, the process 900 begins. At act 904, the user begins by pointing the terminal point 706 of the laser 704 at the first edge 716. At act 906, the user depresses a trigger actuator of the handheld controller 106 to select the first edge 716. At act 908, the user moves the handheld controller 106 to drag the terminal point 706 to a desired end point. For example, the desired end point may represent a final position of the first edge 716. At act 910, the user releases the trigger actuator to finalize the modification of the rectangular prism 708. At act 912, the process 900 ends. FIG. 7F illustrates the modified rectangular prism 708 after execution of the process 900. As illustrated by FIG. 7F, the rectangular prism 708 has been stretched outward perpendicular to the axis of the edge 716.

Modification of a previously-generated object, such as the rectangular prism 708, may affect derivative objects attached to the previously-generated object, such as the rectangular hole 712. Although simplistic proportional scaling techniques may be suitable in, for example, mechanical system modeling, the same principles may not be applicable to architectural modeling. For example, the size and position of a window in a house is typically not selected to be proportional to the size of the house. Rather, the size is typically fixed and the position is typically determined as a specific offset from, for example, an adjacent wall.

Accordingly, the modeling system 100 allows objects to be defined relative to features of other objects. When an object is modified, the modeling system 100 may dynamically modify other objects having features dependent upon the modified object. For example, the rectangular hole 712 may be defined to have a fixed size and a position that is offset from the edge 716 by a pre-specified or dynamically-determined distance. If the position of the edge 716 is modified, the position of the rectangular hole 712 may be dynamically adjusted to account for the modification.

It is to be appreciated that, although the foregoing example is directed to modification of a previously-generated object by selecting an edge feature, other features may be selected. For example, a vertex of an object may be selected and the object may be stretched or compressed relative to the selected vertex, effectively modifying the object in a fashion similar to the original creation of the object. In another example, a surface of an object may be selected and the object may be stretched or compressed relative to the selected surface.

The feature locking feature 610 will now be discussed in greater detail. Generally speaking, the feature locking feature 610 allows users to specify restrictions on certain object features relative to other object features. As discussed above with respect to the object alteration feature 606, the modeling system 100 allows users to modify features of previously-generated objects. However, each previously-generated object includes several other features (for example, sides, vertices, and edges) which will change if any one feature is modified. Accordingly, it may be advantageous for the modeling system 100 to allow users to define how features may and may not change relative to one another.

A user of the modeling system 100 may restrict any feature of a first object relative to any other feature of the first object, or any features of a second object or objects. In a first example, a user may lock a first edge of a first object at a fixed distance from a second edge of the first object. Accordingly, if a user attempts to modify the position of the first edge of the first object, either the modification will be disallowed or the second edge will move with the first edge such that the distance between the first edge and the second edge is maintained at the fixed distance. In alternate embodiments, the first edge of the first object may be locked at a fixed range of distances from the second edge of the second object, such that some variation in distance between the first edge and the second edge is allowed within the fixed range of distances.

In a second example, a first side of a first object is locked at a fixed distance from a first side of a second object. Accordingly, if a user attempts to modify the position of the first side of the first object, either the modification will be disallowed or the first side of the second object will move with the first side of the first object such that the fixed distance is maintained between the first side of the first object and the first side of the second object.

It should be readily apparent to one skilled in the art that an infinite number of feature associations are possible between two or more features of one or more objects according to the foregoing principles. In examples including associated features of two or more objects, the two or more shapes may be directly connected, or may be separated by an arbitrary distance. Although the foregoing examples discuss an association between two individual features, it is to be appreciated that a feature may be restricted relative to two or more other features. Furthermore, although the foregoing examples discuss an association between two features of a same type, it is to be appreciated that associations may be generated between two features of different types. For example, an edge of a first object may be restricted relative to a side of a second object and a vertex of a third object.

For the feature locking feature 610, the system allows each of the planes defining the boundaries of a first cell to be defined in a coordinate frame derived from a face, edge, and one or more vertices of a second cell. The planes of the first cell may be defined in the same coordinate frame. Alternatively, the planes of the first cell may be defined in different coordinate frames derived from faces, edges and vertices of different cells.

An example of a method of deriving a coordinate frame from a face, edge, and one or more vertices will now be described in greater detail. The coordinate frame's 3D orthonormal basis is comprised of a first vector, which is a unit-length normal of the face, a second vector which is a unit-length along the edge, and the cross product of the first and second vectors, which will lie in the face but be orthogonal to both the first and second vectors. One of the face's vertices is used as the origin for the coordinate frame. Alternatively, a point computed from one or more of the face's vertices can be used. For example, an origin point for the coordinate frame may be the average point calculated by summing the vertices and then dividing the sum by the number of vertices.

The real-time Boolean modeling feature 612 will now be discussed in greater detail according to an embodiment. Generally speaking, the real-time Boolean modeling feature 612 allows users to represent complex non-convex 3D objects as collections of simple convex cells interrelated by set-theoretic Boolean operations (for example, differences, unions, and intersections).

In a first example of the real-time Boolean modeling feature 612, a user may desire to create a rectangular hole in a rectangular prism. Rather than using single-gesture operations to generate the rectangular hole, similar to the operations discussed above with respect to FIG. 7D, a user may use the real-time Boolean modeling feature 612. More specifically, a user could generate a cuboid in the shape of the rectangular hole 712, place the cuboid in the region of the rectangular prism 708 where the hole should be created, and apply a difference operator.

The difference operator will remove any region of the rectangular prism 708 that intersects with the cuboid, thereby generating a hole similar to the rectangular hole 712 in the rectangular prism 708. If a feature of the rectangular prism 708 is altered, the hole generated by execution of the Boolean operator will be automatically altered consistent with the shape alteration feature 606 discussed above.

The main geometric processing underlying Boolean operation is computing the overlap of the two objects that are the subjects of the operation. This type of computation may be performed by decomposing complex objects into a collection of convex polyhedrons using a data structure. For example, one data structure configured to achieve this function may include a Binary Partition Tree (BSP). Such a computation may be accelerated by the use of spatial partitioning data structures such as BSPs, k-D Trees, and Octrees.

By contrast, modelling system 100 already maintains all geometric objects as convex polyhedral cells such that no decomposition of non-convex polyhedrons or meshes is needed. Further, the modelling system 100 can use the information it stores about geometric containment of cells inside other cells to accelerate spatial overlap queries without the need for additional data structures, as described above with respect to the entity separation feature 606. Because the modelling system 100 modifies the geometric containment information as cells are dynamically modified to ensure that the information remains valid, the modelling system 100 can implement real-time Boolean operations between objects in a model even as the model is being dynamically edited.

In a second example of the real-time Boolean modeling feature 612, a user may desire to perform a Boolean operation on a shell object. A shell object is a solid cell containing a void cell where the planes of the void cell are configured to maintain a fixed distance from the corresponding planes of its containing solid cell, so that the combined object maintains a shell form even as the form of the solid cell is modified by user editing operations. For example, a shell object may be representative of a building having a hollow interior volume. The real-time Boolean modeling feature 612 allows a user to perform a Boolean operation on shell objects while maintaining the shell form of the resulting shell object. In alternate examples, the user may specify that the outside shell of the hollow object should not be maintained subsequent to execution of a Boolean operation.

When two shell objects that are the subject of a Boolean operation have one or more polygon faces in common, the system can perform Booleans operations that preserve the shell form of the resulting object using a specific algorithm that executes faster than the algorithm used for arbitrary overlap of two objects. In a first example, a first object and a second object may have a face in common where the first object is extruded outwards from the face of the second object as described above with respect to the single-gesture operations feature 602, resulting in the two objects sharing the face on the second object from which the first object was extruded.

In a second example, a first object and a second object may have a face in common where the first object is extruded inwards from the face of the second object as described above with respect to the single-gesture operations feature 602, resulting in the first object being geometrically contained in the second object, and resulting in the two objects sharing the face on the second object from which the first object was extruded inwards. In a third example, two objects may share a face subsequent to a bashing operation as described above with respect to the collision management feature 616.

The modeling system 100 can perform Boolean operations on two shell objects having a polygon face in common by computing, for each shell's outer solid cell participating in the operation, the appropriate shape(s) for one or more additional connection void cells that connect a face of the shell's inner void cell to a face of the shell's outer solid cell. The connection void cells represent a hole in the shell's outer solid cell opening into the hollow volume interior represented which is represented by the shell's inner void cell. The set of connecting void cells is computed independently for the two outer solid cells of the two shell objects according to the method described below which ensures that, taken together, the two shell objects represent a closed shell form that is possibly non-convex.

Figure 15A:
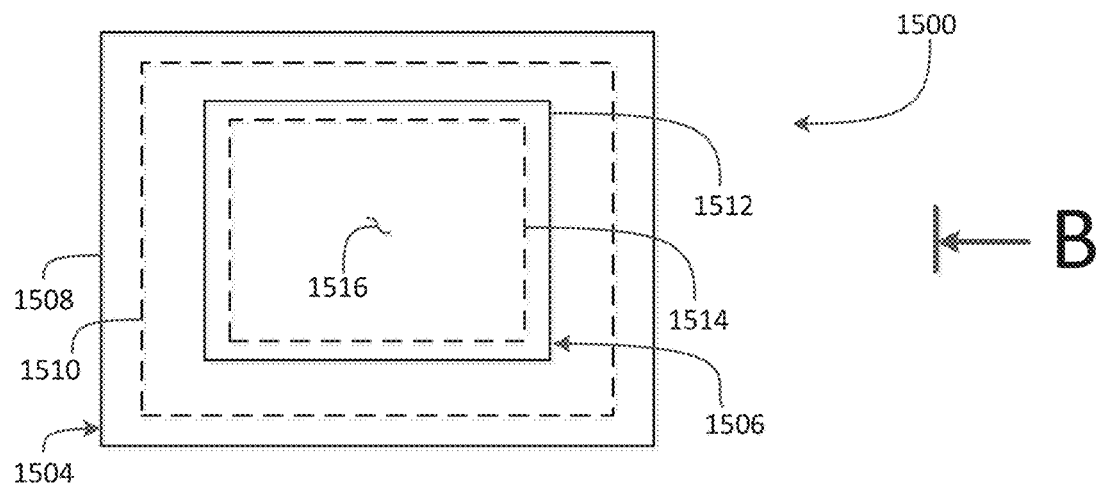
FIG. 15A illustrates a first perspective view of a first configuration of shell objects according to an embodiment.
Figure 15B:
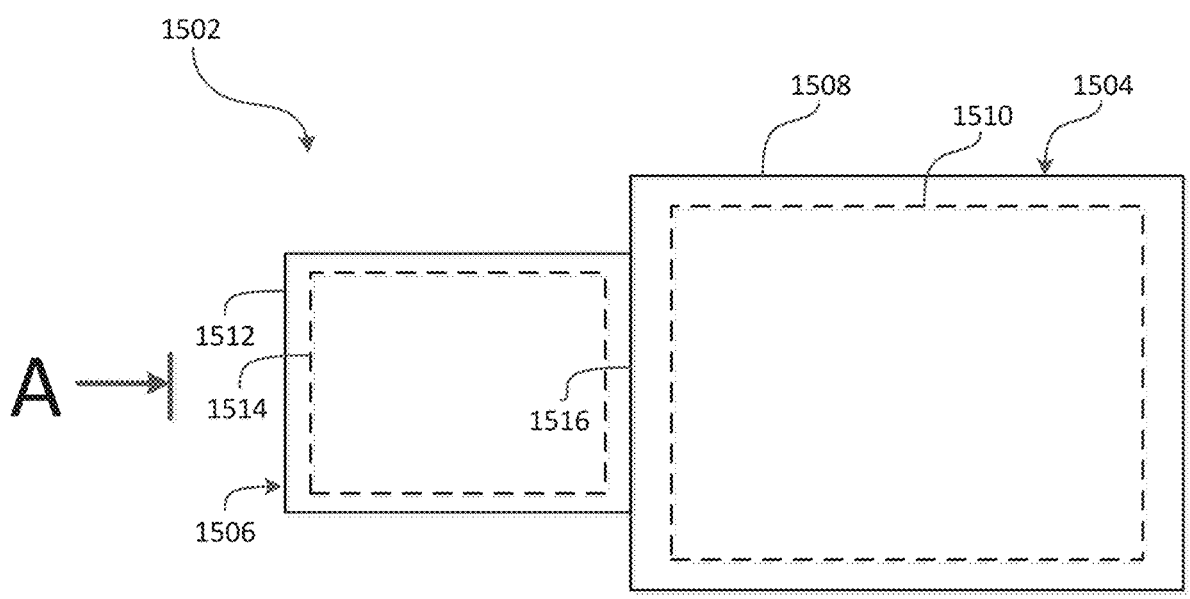
FIG. 15B illustrates a second perspective view of the first configuration of the shell objects according to an embodiment.

If the two shell objects do not overlap except at the objects' shared polygon face, there are two possible configurations. A first configuration will now be described with respect to FIGS. 15A-15C. FIG. 15A illustrates the first configuration according to a first perspective view 1500. FIG. 15B illustrates the first configuration according to a second perspective view 1502. The first configuration includes a first shell object 1504 and a second shell object 1506.

The first shell object 1504 is a hollow object having a first outer solid section 1508, and a first inner void section 1510. The first inner void section 1510 is illustrated with a dotted line to indicate that, from the outside of the first shell object 1504, the first inner void section 1510 will not be visible.

The second shell object 1506 is also a hollow object having a second outer solid section 1512, and a second inner void section 1514. The first shell object 1504 and the second shell object 1506 only overlap at a single shared face polygon 1516, where an entire face of the second outer solid section 1512 of the second shell object 1506 overlaps with a portion of the first outer solid section 1508 of the first shell object 1504.

As discussed above, the modeling system 100 can perform Boolean operations on the two shell objects 1504, 1506 to generate a connecting void such that a single void exists within the shell objects 1504, 1506. A discussion of the generation of the single connecting void will be explained first with respect to the second shell object 1506, and second with respect to the first shell object 1506.

With respect to the second shell object 1506, the modeling system 100 extends the second inner void section 1514 to the shared face polygon 1516, through the second outer solid section 1512, such that the second inner void section 1514 is expanded into a first connecting region. In effect, the second inner void section 1514 is extended up to the shared face polygon 1516 and removes the portion of the outer solid section 1514 which previously occupied the first connecting region.

With respect to the first shell object 1504, the modeling system 100 generates a connecting void which extends from the shared face polygon 1516 to the first inner void section 1510, through the first outer solid section 1508. In effect, the connecting void removes the portion of the outer solid section 1510 which previously occupied the newly generated connecting void. The first inner void section 1510 and the second inner void section 1514 meet at the shared face polygon 1516.

Figure 15C:
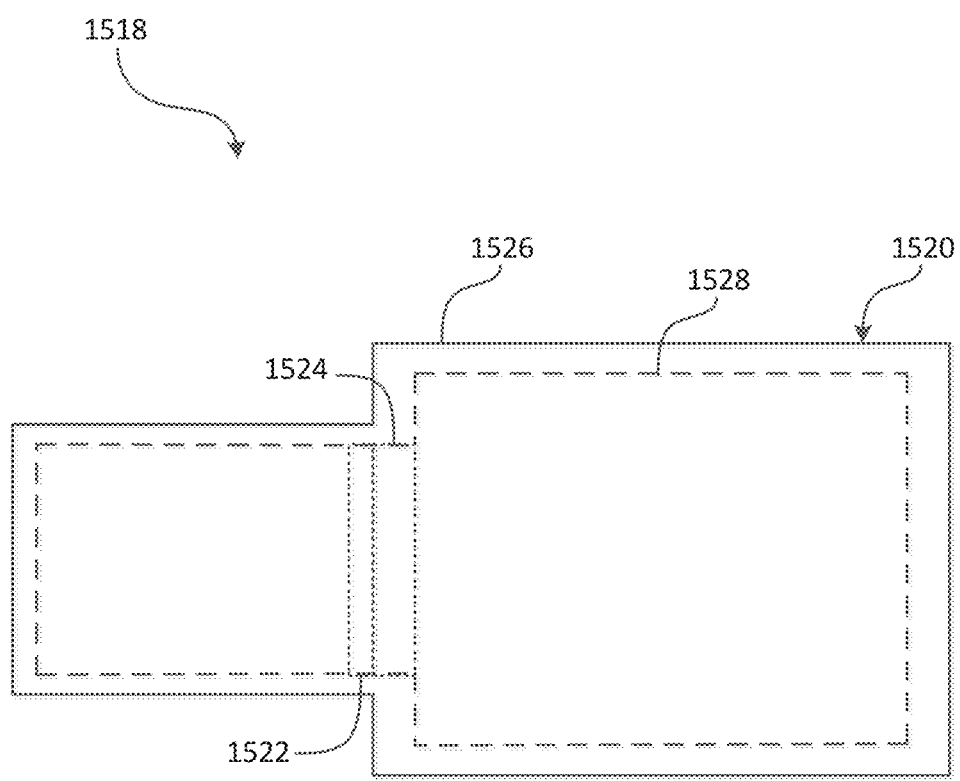
FIG. 15C illustrates a perspective view of the first configuration of the shell objects after the shell objects have been connected to form a single shell object.

FIG. 15C illustrates a perspective view 1518 of the first configuration after the first shell object 1504 and the second shell object 1506 have been connected to form a single shell object 1520. A first region 1522 indicates the first connecting region, and a second region 1524 indicates where the second connecting void was created. The two inner voids sections 1510, 1514 have merged into a single void, the shell object 1520 is considered to include a single outer solid section 1526 and a single inner void section 1528.

Figure 16A:
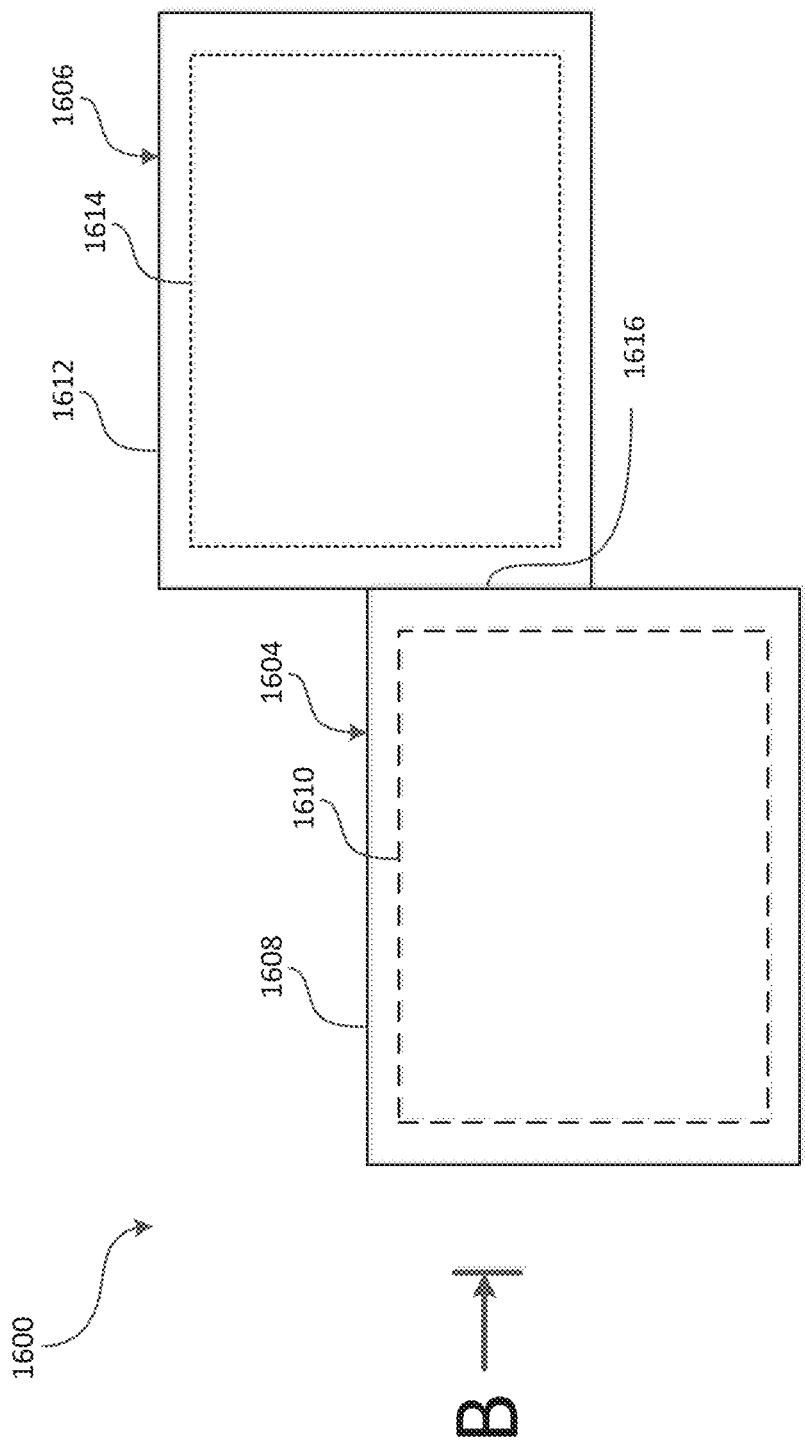
FIG. 16A illustrates a first perspective view of a second configuration of shell objects according to an embodiment.
Figure 16B:
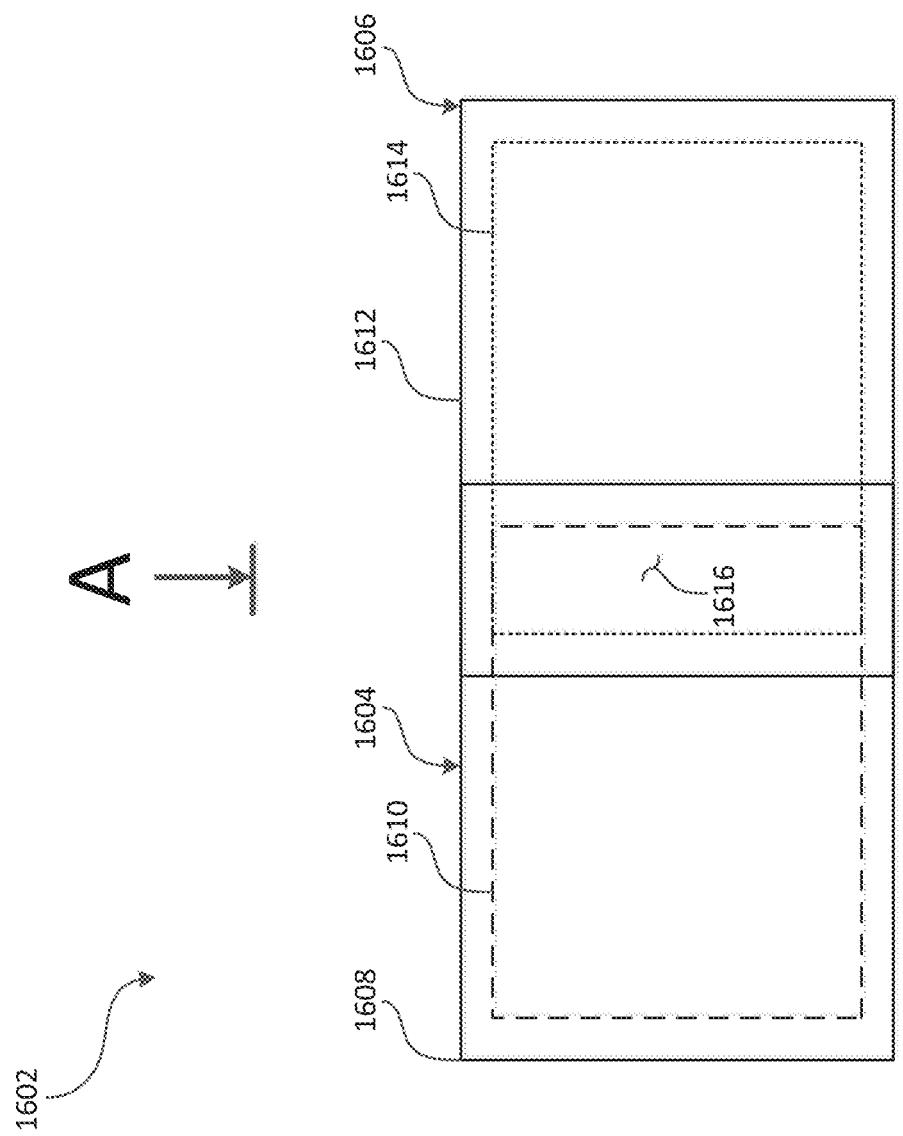
FIG. 16B illustrates a second perspective view of the second configuration of the shell objects according to an embodiment.

A second configuration will now be described with respect to FIGS. 16A-16C. FIG. 16A illustrates the second configuration according to a first perspective view 1600. FIG. 16B illustrates the second configuration according to a second perspective view 1602. The second configuration includes a first shell object 1604 and a second shell object 1606.

The first shell object 1604 is a hollow object having a first outer solid section 1608, and a first inner void section 1610. The second shell object 1606 is also a hollow object having a second outer solid section 1612, and a second inner void section 1614. The first shell object 1604 and the second shell object 1606 only overlap at a single shared face polygon 1616, which is defined as the mathematical set union of the first outer solid section 1608 and the second outer solid section 1612.

The second configuration is similar to the first configuration. However, whereas the entirety of a face of the second shell object 1506 overlapped with the first shell object 1504 in the first configuration (i.e., shared face polygon 1516 of the first configuration represented the entirety of a face of the second shell object 1506), the first shell object 1604 and the second shell object 1606 only partially overlap (i.e., the shared face polygon 1616 of the second configuration does not represent the entirety of any face of the first or second shell objects 1604, 1606).

The modeling system 100 may perform Boolean operations on the two shell objects 1604, 1606 to generate a connecting void between the two shell objects 1604, 1606, similar to the Boolean operations discussed above with respect to the first configuration. A first connecting void is generated in the first shell object 1604, and extends from the first inner void section 1610 to the shared polygon face 1616 through the outer solid section 1608. A second connecting void is generated in the second shell object 1606, and extends from the second inner void section 1614 to the shared polygon face 1616 through the outer solid section 1612.

Figure 16C:
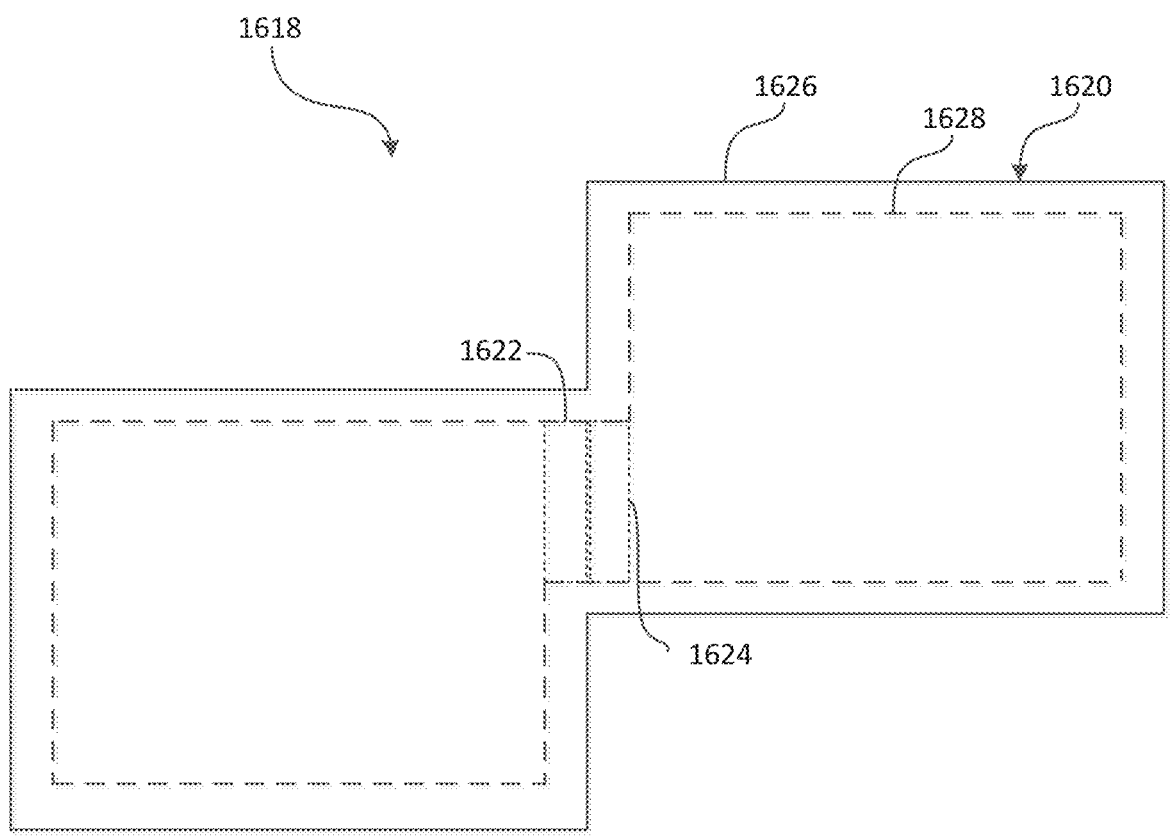
FIG. 16C illustrates a perspective view of the second configuration of the shell objects after the shell objects have been connected to form a single shell object according to an embodiment.

FIG. 16C illustrates a perspective view 1618 of the second configuration after the first shell object 1604 and the second shell object 1606 have been connected to form a single shell object 1620. A first region 1622 indicates where the first connecting void was created, and a second region 1624 indicates where the second connecting void was created. Because the connecting regions have merged the two separate inner voids sections 1610, 1614 into a single void, the shell object 1620 is considered to include a single outer solid section 1626 and a single inner void section 1628.

To generate the first connecting void in the first shell object 1604, the modeling system 100 defines the first connecting void in the first outer solid section 1608 as having one face defined by the place of the first inner void section 1610 that is closest to the shared polygon face 1616 (which, as discussed above, represents the mathematical set union of the first outer solid section 1608 and the second outer solid section 1612), and one face defined by the shared polygon face 1616 itself. The remaining faces of the first connecting void are the planes from the first inner void section 1610 and the second inner void section 1614 which intersect the shared polygon face 1616.

Similar principles apply with respect to the second connecting void, which will intersect with the first connecting void where the shared polygon face 1616 previously existed prior to generating the connecting voids. Taken together, the first connecting void and the second connecting void will appear as a single convex opening (i.e., the single inner void section 1628) between the first inner void section 1610 and the second inner void section 1614, thereby preserving the single overall shell form of the single outer solid section 1626.

In the case where the two shell objects overlap such that a first shell object is contained in a second shell object, the first object may share a face with one, two, or three of the second object's faces. In this case, performing Boolean operations on the two shell objects sharing polygon faces includes two steps. In a first step, a procedure for extruding a first shell object inwards from a second shell object is modified as follows. Instead of having the first shell object's outer solid share a face with the second object's outer solid cell, as would be the case for ordinary solid cell object extrusion, the first shell object is placed inside the second object's inner void cell, and shares one, two, or three faces with the second object's inner void cells in lieu of the second shell object's outer solid cell.

In a second step, the modeling system 100 will create as many connecting void cells in the second shell object's outer solid as the number of faces shared between the first object's outer solid cell and second object's inner void cell. Because the first shell object is geometrically contained by the second shell object, the faces of the first shell object are fully contained by the faces of the second shell object. Therefore, the inner void section is expanded towards the second shell's inner void faces using the method discussed.

In the case of two or three shared faces, the modeling system 100 creates one additional connecting void cell to remove the solid cell that remains after the two or three connecting voids have been created. While the first shell object is geometrically contained in the second shell object, the connecting voids will appear from the outside as a hole or cavity in the second object while still preserving the shell form of the combined object.

Two shell objects may overlap in more general ways, in configurations for which the method for fast Boolean operations on shell objects is not applied. In these configurations, the modeling system 100 implements Boolean operations on the shell objects in terms of Boolean operations on the objects' outer solid cells and inner void cells as follows.

For a mathematical set union operation between a first shell object and a second shell object, the modeling system 100 computes the union of the two outer solid cells, and subtracts the union of the two inner void cells from the union of the two outer solid cells. For a mathematical set intersection operation between a first shell object and a second shell object, the modeling system 100 computes the intersection of the two outer solid cells and subtracts the intersection of the two inner void cells from the intersection of the two outer solid cells.

For a mathematical difference operation where a second shell object is subtracted from a first shell object, the modeling system 100 subtracts the first inner void cell from the first outer solid cell, unions the result of the subtraction with the intersection of the two outer solid cells, and subtracts the second inner void cell from the union. These operations allow shell objects to be combined with Boolean operations while preserving the shell form of the resulting combined object. The modeling system 100 may implement these operations in a different order or use different Boolean operations on the underlying solid and void cells so long as the operations result in the same sets as described by the operations discussed above.

It is to be appreciated that the Boolean operations executed between two shell objects, as discussed above, may be continuously re-executed. The modeling system 100 may update voids as a shell object is modified, such as by adding, removing, or modifying connecting voids or shell shapes. Accordingly, while a shell object may be generated from multiple constitute shell objects, the shell object may still be freely edited by a user.

The scale transitioning feature 614 will now be discussed in greater detail. Generally speaking, the scale transitioning feature 614 allows a user to modify a scale at which models are displayed and edited. For example, a user designing a building may want to edit the building at model-scale (for example, where the top of the building is at "eye level"), but may want to edit rooms within the building at human-scale.

Figure 10A:
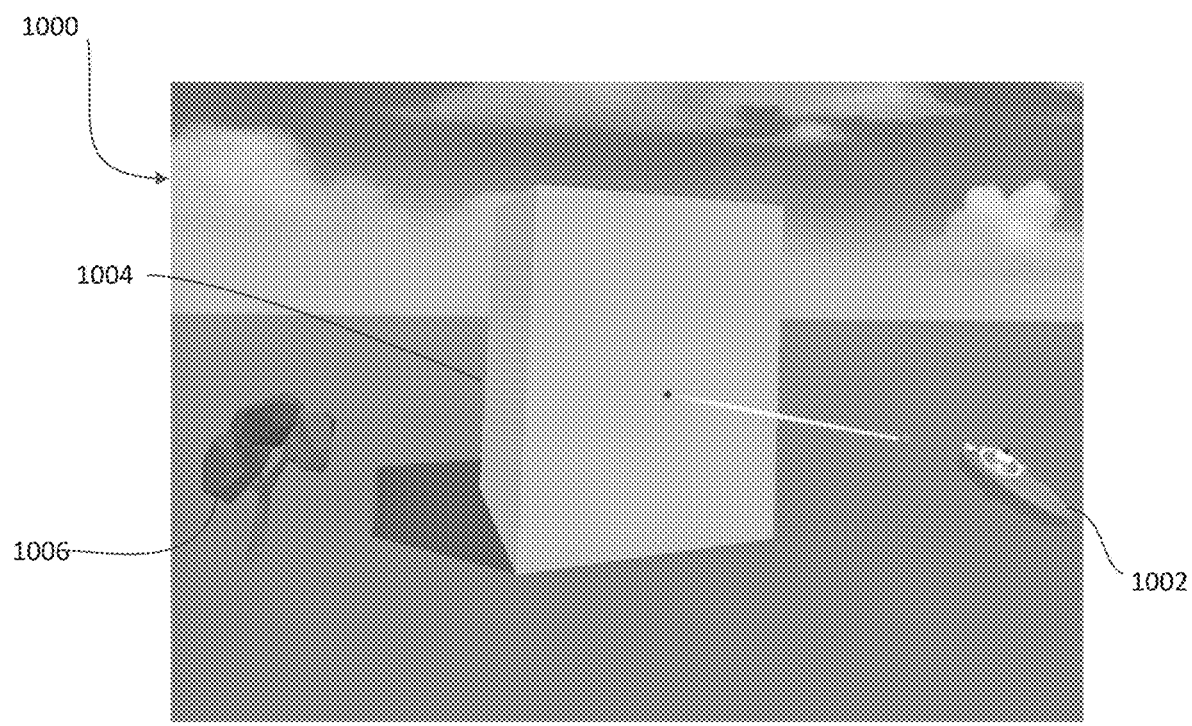
FIG. 10A illustrates a view of a simulated environment according to an embodiment.

By way of example, FIG. 10A illustrates a building-scale POV of a simulated environment 1000 according to one embodiment. The simulated environment 1000 may be generated, for example, by the modeling system 100. The view of the simulated environment 1000 includes a virtual controller 1002, a rectangular prism 1004, and a model of a tree 1006. The virtual controller 1002 is a virtual representative of a controller, such as the handheld controller 106. The rectangular prism 1004 is representative of a crude building.

A user may want to edit the rectangular prism 1004 at a smaller scale. For example, the user may find it more manageable to construct a "door" on the rectangular prism 1004 if the user is viewing the rectangular prism 1004 at a human-scale POV. The scale transitioning feature 614 allows a user to easily transition to a scale appropriate for a given task.

For example, where the user is using the handheld controller 106, the user may move her finger around the touch pad 404 in a counter-clockwise direction to scale down (i.e., make objects in the simulated environment larger) or in a clockwise direction to scale up (i.e., make objects in the simulated environment smaller). Alternatively, a user may actuate one of the actuators 402 to open a menu, navigate to a scale setting, and alter the scale setting as desired. In alternate embodiments, any other method of altering a scale may be implemented.

Figure 10B:
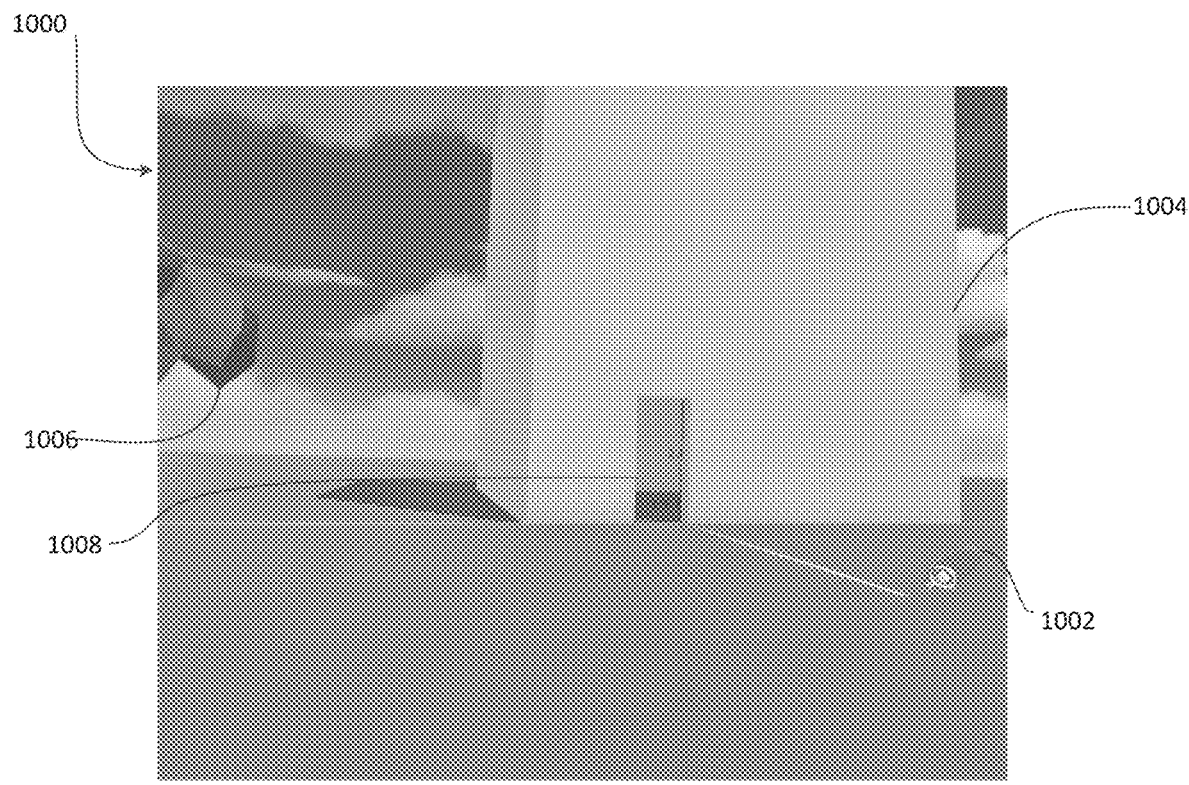
FIG. 10B illustrates a view of the simulated environment according to an embodiment.

FIG. 10B illustrates a human-scale POV of the simulated environment 1000 according to an embodiment. The rectangular prism 1004 includes a rectangular hole 1008. Where the rectangular prism 1004 is representative of a building, the rectangular hole 1008 may be representative of a door in the building. Construction of the rectangular hole 1008 may be significantly easier for a user at the human-scale POV illustrated by FIG. 10B than the building-scale POV illustrated by FIG. 10A.

In some embodiments, transitioning to a smaller or larger scale may have a corresponding effect on controller sensitivity. For example, where a user transitions from model-scale to human-scale, the sensitivity of the controller may be increased. The effect of the change in sensitivity is that a movement of a physical, "real world" controller at model-scale will create a larger object than will an identical movement of the "real world" controller at human-scale. The sensitivity feature may be modified or disabled by a user as desired. Similar principles apply to editing the features of shapes and moving around within the model.

The collision management feature 616 will now be discussed in greater detail. Generally speaking, the collision management feature 616 allows users of the modeling system 100 to combine two or more objects. For example, the user may desire to attach a first face of a first object to a first face of a second object, such that the first object and the second object are combined. The modeling system 100 allows a user to select a first object, and "bash" the first object into a second object to combine the first and second objects.

Figure 11:
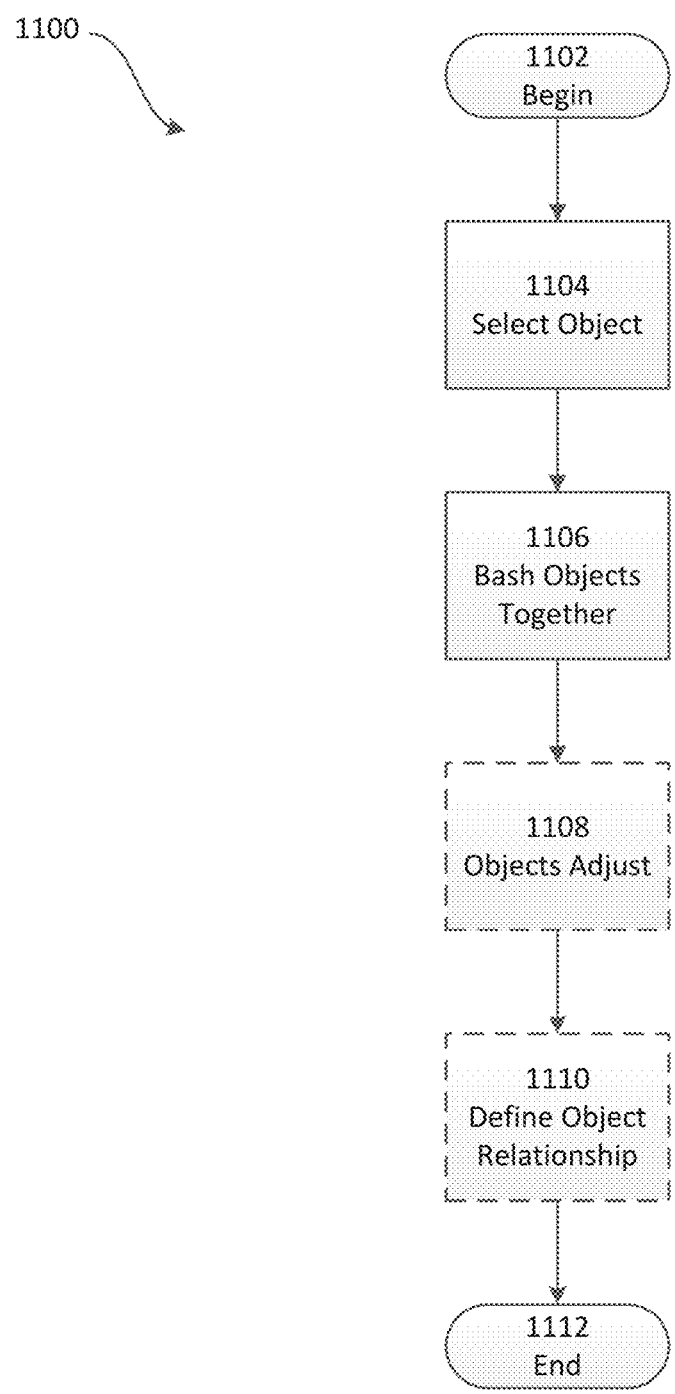
FIG. 11 illustrates a process of bashing objects together according to an embodiment.

FIG. 11 illustrates a process 1100 of bashing a first object and a second object together according to an embodiment. At act 1102, the process 1100 begins. At act 1104, a user selects the first object. At act 1106, the user bashes the first object into the second object. For example, the user may either extend the first object into the second object or may move the first object into the second object while retaining the original shape of the first object.

At act 1108, either the first object adjusts to the second object, the second object adjusts to the first object, or a combination of both. Act 1108 is an optional act executed subject to user preference. In alternate embodiments, no adjustment may occur. At act 1110, the user specifies the relationship of the first object to the second object. Act 1110 is an optional act subject to user preference. For example, the user may specify that if the second object is moved, the first object should move with the second object while retaining its original shape.

In alternate embodiments, the user may specify that if the second object is moved, the first object should be stretched to move with the second object. In still other embodiments, the user may specify no preference, and the modeling system 100 may dynamically determine how the first object should be affected if the second object is modified. At act 1112, the process 1100 ends.

Figure 12A:
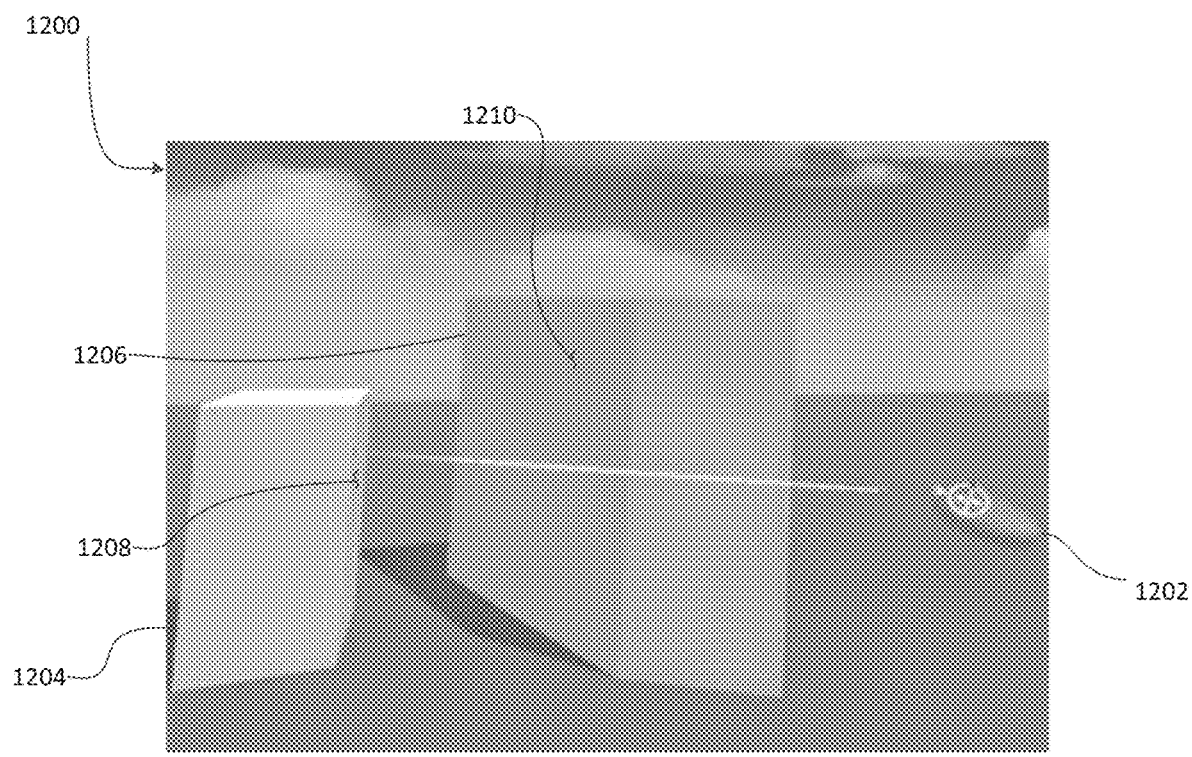
FIG. 12A illustrates a view of a simulated environment according to an embodiment.
Figure 12B:
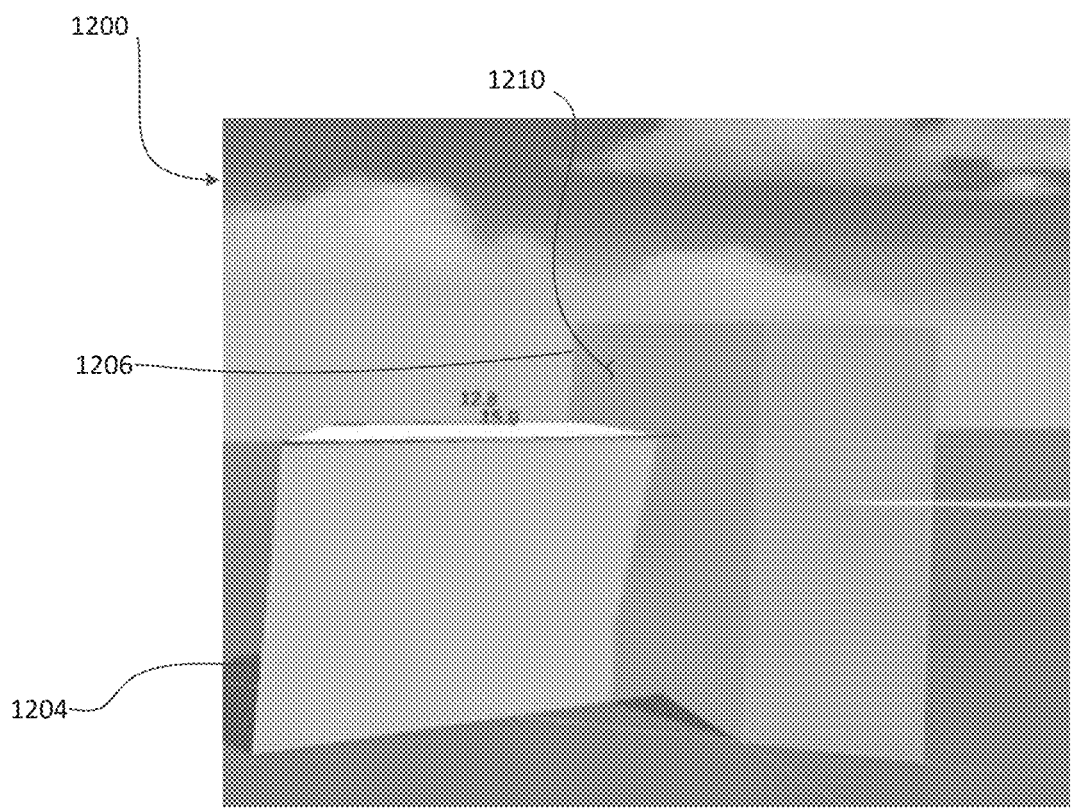
FIG. 12B illustrates a view of the simulated environment according to an embodiment.
Figure 12C:
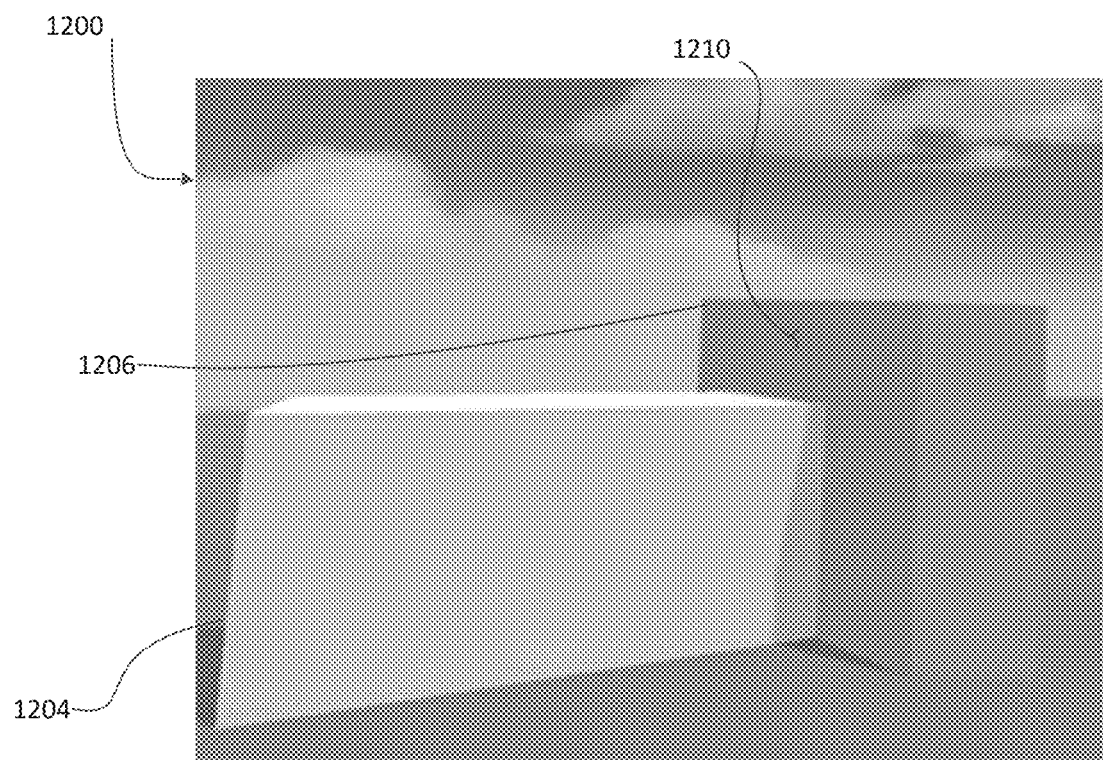
FIG. 12C illustrates a view of the simulated environment according to an embodiment.

An example of the process 1100 will now be illustrated with respect to FIGS. 12A-12C. FIG. 12A illustrates a simulated environment 1200 according to an embodiment. The simulated environment 1200 includes a virtual controller 1202, a first object 1204, and a second object 1206. The first object 1204 includes a first face 1208, and the second object 1206 includes a second face 1210. A user desires to combine the first object 1204 with the second object 1206 by attaching the first face 1208 to the second face 1210.

At act 1102, the process 1100 begins. At act 1104, the user selects the first face 1208 of the first object 1204. At act 1106, the user bashes the first face 1208 into the second face 1210. In the illustrated embodiment, the user has previously specified that movement of the first face 1208 should stretch the first object 1204 rather than moving the first object 1204. In alternate embodiments, the user may specify that movement of the first face 1208 should move the first object 1204 while retaining the shape of the first object 1204. At act 1108, the first object 1204 adjusts to the second object 1206. For example, in one embodiment the first face 1208 is adjusted to be normal to the second face 1210. In alternate examples, the user may specify that act 1108 is to be skipped and that the first object 1204 should not be adjusted.

FIG. 12B illustrates the simulated environment 1200 subsequent to execution of act 1108. The first face 1208, which is occluded in FIG. 12B, has been adjusted to be normal to the second face 1210. At act 1110, the user specifies the relationship between the first object 1204 and the second object 1206. For example, the user may specify that if the second object 1206 is moved, the first object 1204 should stretch such that the connection between the first object 1204 and the second object 1206 is maintained.

Alternatively, the user may specify that if the second object 1206 is moved, the first object 1204 should move with the second object 1206 without changing the shape of the first object 1204. In yet other embodiments, the user may not specify a relationship between the first object 1204 and the second object 1206, and the modeling system 100 will dynamically determine a relationship between the first object 1204 and the second object 1206.

FIG. 12C illustrates the simulated environment 1200 subsequent to execution of act 1110, where a user has specified that the first object 1204 should stretch with the second object 1206. As illustrated by FIG. 12C, the second object 1206 has been moved, and the first object 1204 has stretched with the second object 1206, thereby elongating the first object 1204. At act 1112, the process 1100 ends.

Generally speaking, there are two different methods of manipulating objects in the modeling system 100. In a first method, the user can move or edit objects from a distance using a pointer emitting from a controller operated by the user. The first method may be implemented where the user interacts with the modeling system 100 using a controller. In a second method, the user can move or edit objects by reaching forward and grabbing objects or object features for direct manipulation, as if holding the object directly in the user's hand. The second method may be implemented where the user interacts with the modeling system 100 by moving the user's hands, where the user's hands' movement is captured by one or more cameras or sensors.

The bashing feature discussed above applies to both the first method and the second method of object manipulation, but in some cases, more advanced forms of bashing may take place. For example, more advanced forms of bashing may take place where a user holds objects in the user's hand. In this case, the user may simultaneously bash two objects together so that the objects connect, while rotating the held object and possibly squashing the held object against a target object, thereby resulting in deformation of the object being held.

This deformation also applies when manipulating objects at a distance, but possibly in a more restrictive way. The modeling system 100 can translate bashing and squashing gestures and movement efficiently. For example, the modeling system 100 may be configured to determine when the user has moved a held object so far through the target object that the held object passes fully through the target object fully intact.

The prefabrication library feature 618 will now be discussed in greater detail according to an embodiment. Generally speaking, the prefabrication library feature 618 provides a user with access to a library of prefabricated models or model features. Models may include prefabricated objects, ranging from entire structures to room furnishings, and model features may include features derivative from other objects, such as wall patterns and/or textures. The library of features may be sorted into various categories including, for example, a residential library, a commercial library, a landscaping library, and so forth.

For example, a user modeling a residential home may desire access to a library of residential models. The residential models may include prefabricated house models, furniture models, light fixture models, and so forth. Alternatively, a user modeling a commercial building may desire access to a library of models including prefabricated office building models, commercial fixture models, commercial light fixture models, and so forth. In another example, a user modeling a residential home or commercial building may desire access to a library of landscaping models. The landscaping models may include shrubbery models, water body models (for example, fountains, artificial or natural ponds, and pools), outdoor decorations, and so forth.

The prefabrication library feature 618 may also provide a library of derivative features or patterns which may be applied to modeled objects. For example, a user modeling a brick building may be able to access a library of patterns and apply a brick pattern to the building model. In some embodiments, application of a derivative feature only changes an appearance of the model. In other embodiments, application of the derivative feature changes the appearance of the model as well as the texture of the model. For example, where a brick pattern is selected, the individually-modeled bricks may protrude from a wall on which the pattern appears.

It is to be appreciated that, although specific examples of prefabricated models and model features have been discussed, any number and type of models and model features may be provided. In some embodiments, a user may save a generated model in a library of models for later use. The user may save the generated model in a private library, or in a public library. For example, the user may upload the generated model to a public library which other users may access and download the model from. The user may, in turn, access a dynamic library of models and model features generated by other users and download models or model features therefrom. Furthermore, the user may use the system to create her own library of prefabricated models using the modeling application, for use within the modeling application.

The cross-sectioning feature 620 will now be discussed in greater detail. Generally speaking, the cross-sectioning feature 620 allows users of the modeling system 100 to view a cross-section of generated modeled. In at least one embodiment, the modeling system 100 enables a user to create a cross-section of a modeled object at any orientation.

In a first example, where the user is utilizing the handheld controller 106, the user may view a cross-section of a modeled object by tilting the handheld controller 106. In some embodiments, a user may be requested to select an object to view a cross-section of. In other embodiments, the user may not be requested to select an object, and tilting the handheld controller 106 may generate a cross-section of all modeled objects.

Figure 13A:
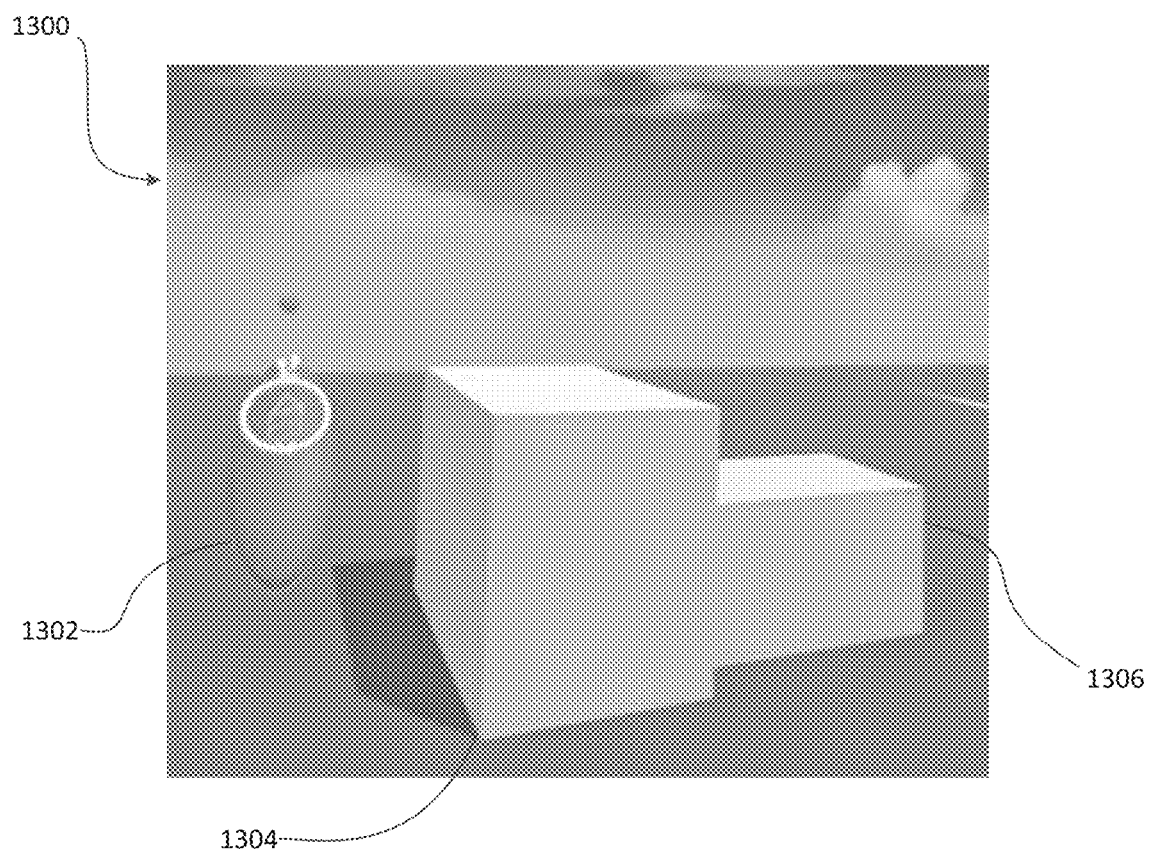
FIG. 13A illustrates a view of a simulated environment according to an embodiment.

FIG. 13A illustrates a simulated environment 1300 according to an embodiment. The simulated environment 1300 may be generated, for example, by the modeling system 100. The simulated environment 1300 includes a first virtual controller 1302, a first object 1304, and a second object 1306. The first virtual controller 1302 is a virtual representation of a controller, such as the handheld controller 106. In one embodiment, the first object 1304 and the second object 1306 are hollow, and a user desires to view a cross-section of the first object 1304 and the second object 1306. Accordingly, the user may tilt the handheld controller 106 to generate a cross-section of the first object 1304 and the second object 1306.

Figure 13B:
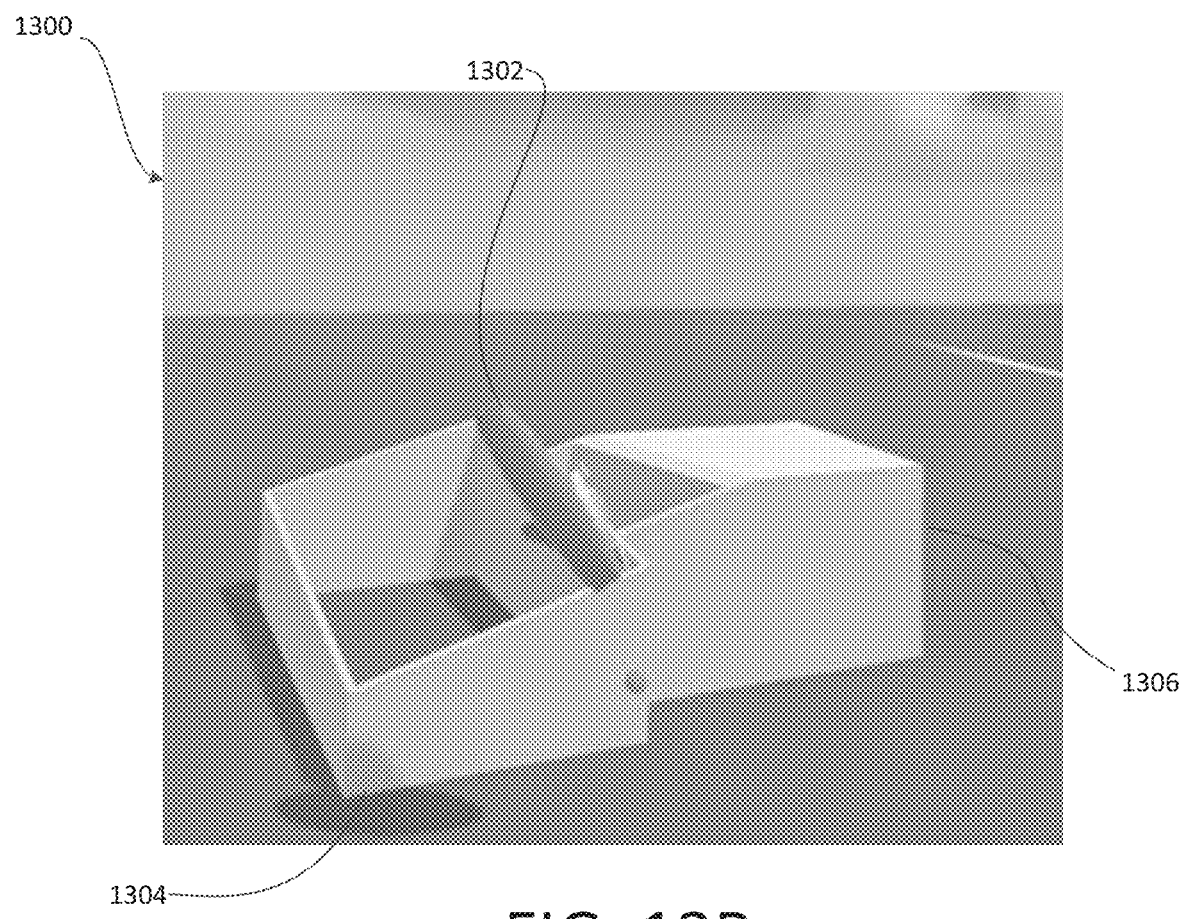
FIG. 13B illustrates a view of the simulated environment according to an embodiment.

FIG. 13B illustrates the simulated environment 1300 subsequent to tilting the handheld controller 106 according to an embodiment. As illustrated by FIG. 13B, a cross-section of the first object 1304 and the second object 1306 is displayed, allowing a user to view the inside of the first object 1304 and the second object 1306. The user may temporarily lock the cross-sectional view, such that the cross-sectional view is maintained while allowing the user to move the handheld controller 106 freely. For example, the user may actuate one of the actuators 402 corresponding to a cross-sectional view locking selection. Accordingly, the user is capable of editing the first object 1304 and the second object 1306 while the cross-sectional view is maintained.

The multi-controller modeling feature 622 will now be described in greater detail. Generally speaking, the multi-controller modeling feature 622 allows one or more users of the modeling system 100 to interact with a single simulated environment using several controllers simultaneously. Multiple controllers may be utilized by a single user (for example, by holding one controller in each hand), by multiple users simultaneously interacting with the modeling system 100, or a combination of both. For example, multiple users may interface with the simulated environment generated by the modeling system 100 via a local connection, or via a remote network connection (for example, via an Internet connection).

In one example, a user may interact with a simulated environment using two controllers. Continuing with the example discussed above with respect to FIGS. 13A and 13B, the user may desire to control a cross-sectional view of the first object 1304 and the second object 1306 with a first controller, while generating a hole in the first object 1304 with a second controller.

Figure 13C:
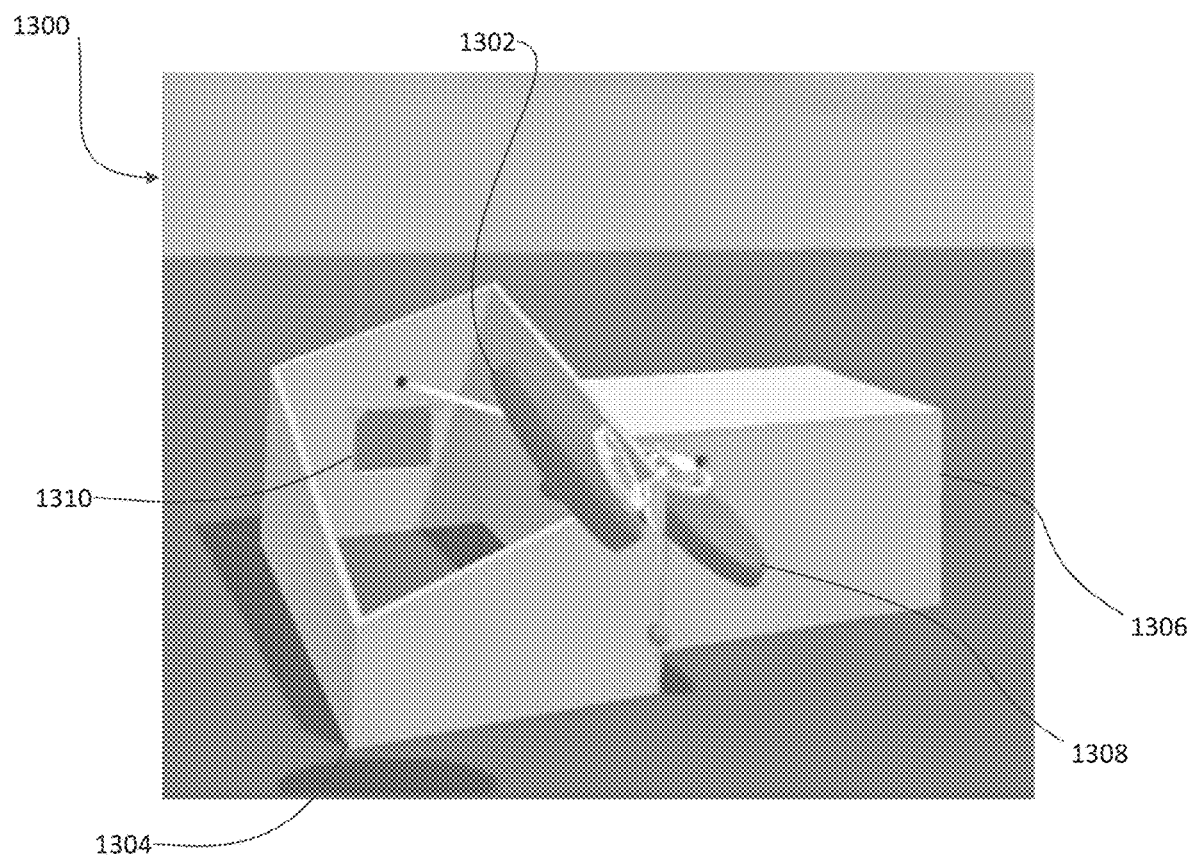
FIG. 13C illustrates a view of the simulated environment according to an embodiment.

FIG. 13C illustrates the simulated environment 1300 interfacing with multiple controllers according to an embodiment. The simulated environment includes a second virtual controller 1308, representative of a controller such as the handheld controller 106. As illustrated by FIG. 13C, the first virtual controller 1302 is maintained in a tilted position to maintain the cross-sectional view, while the second virtual controller 1308 is utilized to generate a hole 1310 in the first object 1304.

As discussed above, the modeling system 100 may allow multiple users to interact with a single simulated environment, such as the simulated environment 1300, simultaneously. For example, a first user may controller the first virtual controller 1302 while a second user controls the second virtual controller 1308.

In some embodiments, a user who initially generates a simulated environment may control access permissions by other users. For example, the user may specify a "white list" of users allowed to access the simulated environment, or may make the simulated environment globally accessible to all users. The user may also implement additional security measures including, for example, a stipulation that other users may only access the simulated environment if the user is actively interacting with the simulated environment.

The realistic physical behavior modeling feature 624 will now be discussed in greater detail. Generally speaking, the realistic physical behavior modeling feature refers to the realistic physical behavior modeled in simulated environments generated by the modeling system 100. Modeled physical interactions may involve any number and combination of users, objects, the simulated environment, and so forth.

An example of a user-object interaction is described above with respect to the single-gesture operations feature 602. As discussed above, the momentum with which an object is created by a user may affect the object's final shape. Accordingly, an interaction between the user and an object may be modeled with realistic momentum effects.

An example of a user-object interaction and an object-object interaction includes a user, a first object, and a second object. The user may select the first object, and "throw" the first object above the second object by releasing the first object with momentum. The first object will fall consistent with modeled effects of gravity and collide with the second object. The collision with the second object will similarly be modeled consistent with realistic physical principles.

In alternate embodiments, the realistic physical behavior modeling feature 624 may be omitted and replaced with an alternate set of physical rules. For example, a user may be able to adjust the effects of gravity or momentum in the simulated environment.

The 3D model exporting feature 626 will now be discussed in greater detail. Generally speaking, the 3D model exporting feature 626 refers to the ability of the modeling system 100 to export models created in a simulated environment to an external entity using any known means of data communication, such as by communicating a computer-readable file encoding the model to a destination.

For example, the external entity may include an external monitor from which a user may view the model, or a 3D printer capable of printing a physical 3D model of the virtual model. The 3D printer may print a physical 3D model as a single part, or as a collection of parts which may be assembled after being printed. In a second embodiment, the 3D model exporting feature 626 may be utilized to communicate a file encoding a model to another user via, for example, the Internet. In other examples, the modeling system 100 may export computer-readable data representative of a model to any other entity.

It is to be appreciated that a holistic modeling system has been described which is particularly advantageous for architectural modeling. In some embodiments, objects in a simulated environment modeled by the modeling system are represented as separate 3D polyhedral cells. Representing objects as separate entities, rather than "baking" objects into a single static mesh, allows users to easily modify previously-generated objects. Additionally, representing objects as 3D polyhedral cells offers significant advantages in computational simplicity which results in a higher-quality user experience.

Although certain optimization techniques such as occlusion culling are known with respect to static mesh-based systems, the modeling system 100 is operable to execute some or all of the features 600 in connection with dynamic volumetric cells. Certain embodiments of the modeling system 100 provide an irregular volumetric cellular network including cells bonded at common features, which may be directly manipulated by a user.

Figure 14:
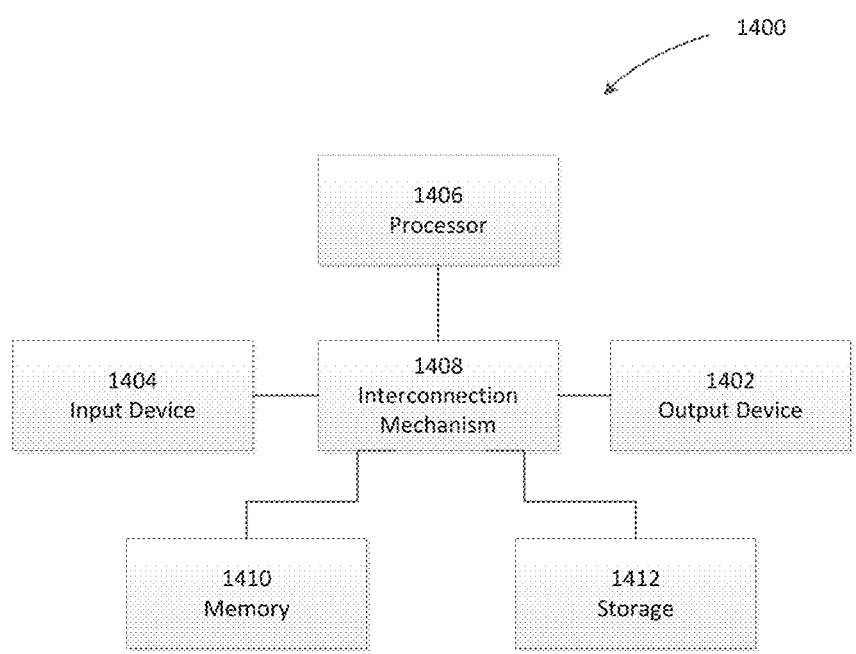
FIG. 14 illustrates a block diagram of a system controller.

FIG. 14 illustrates an example block diagram of computing components forming a system 1400 which may be configured to implement one or more aspects disclosed herein. For example, the system 1400 may be communicatively coupled to the system controller 102 or included within the controller 102. The system 1400 may also be configured to operate a bidirectional converter as discussed above.

The system 1400 may include for example a computing platform such as those based on Intel PENTIUM-type processor, Motorola PowerPC, Sun UltraSPARC, Texas Instruments-DSP, Hewlett-Packard PA-RISC processors, or any other type of processor. System 1400 may include specially-programmed, special-purpose hardware, for example, an application-specific integrated circuit (ASIC). Various aspects of the present disclosure may be implemented as specialized software executing on the system 1400 such as that shown in FIG. 14.

The system 1400 may include a processor/ASIC 1406 connected to one or more memory devices 1410, such as a disk drive, memory, flash memory or other device for storing data. Memory 1410 may be used for storing programs and data during operation of the system 1400. Components of the computer system 1400 may be coupled by an interconnection mechanism 1408, which may include one or more buses (e.g., between components that are integrated within a same machine) and/or a network (e.g., between components that reside on separate machines). The interconnection mechanism 1408 enables communications (e.g., data, instructions) to be exchanged between components of the system 1400. The system 1400 also includes one or more input devices 1404, which may include for example, a keyboard or a touch screen. The system 1400 includes one or more output devices 1402, which may include for example a display. In addition, the computer system 1400 may contain one or more interfaces (not shown) that may connect the computer system 1400 to a communication network, in addition or as an alternative to the interconnection mechanism 1408.

The system 1400 may include a storage system 1412, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 1410 that allows for faster access to the information by the processor/ASIC than does the medium. This memory 1410 may be a volatile, random access memory such as a dynamic random access memory (DRAM) or static memory (SRAM). It may be located in storage system 1412 or in memory system 1410. The processor 1406 may manipulate the data within the integrated circuit memory 1410 and then copy the data to the storage 1412 after processing is completed. A variety of mechanisms are known for managing data movement between storage 1412 and the integrated circuit memory element 1410, and the disclosure is not limited thereto. The disclosure is not limited to a particular memory system 1410 or a storage system 1412.

The system 1400 may include a computer platform that is programmable using a high-level computer programming language. The system 1400 may be also implemented using specially programmed, special purpose hardware, such as an ASIC. The system 1400 may include a processor 1406, which may be a commercially available processor such as the well-known Pentium class processor available from the Intel Corporation. Many other processors are available. The processor 1406 may execute an operating system which may be, for example, a Windows operating system available from the Microsoft Corporation, MAC OS System X available from Apple Computer, the Oracle Solaris Operating System available from Oracle, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An architectural modeling system, the system comprising:
    an input controller including one or more sensors, the input controller being configured to
        detect, with the one or more sensors, a single continuous movement of a user's body; and
        generate, based on detecting the single continuous movement of the user's body, an object modification signal;
    a display including a display screen; and
    a system controller configured to be coupled to the input controller and the display, the system controller configured to:
        generate a three-dimensional simulated environment including a virtual object represented as a polyhedral volumetric object;
        display a field of view of the simulated environment on the display screen;
        receive, from the input controller, the object modification signal;
        modify, based on the object modification signal, the virtual object; and
        display the modified virtual object in the field of view of the simulated environment on the display screen.

2. The system of claim 1, wherein the input controller includes one or more actuators, and wherein the input controller is configured to:
    detect, with an actuator of the one or more actuators, an actuation of the actuator;
    detect, with the one or more sensors, the single continuous movement of the user's body by detecting a single continuous movement of the input controller;
    generate, based on detecting the actuation of the actuator and the single continuous movement of the input controller, the object modification signal; and
    communicate the object modification signal to the system controller.

3. The system of claim 2, wherein the input controller is further configured to:
    detect, with the one or more sensors, a tilted orientation of the input controller;
    generate the object modification signal responsive to detecting the tilted orientation of the input controller, the object modification signal being indicative of the tilted orientation of the input controller; and
    provide the object modification signal to the system controller.

4. The system of claim 3, wherein displaying the modified virtual object in the field of view of the simulated environment on the display screen includes displaying, a cross-section view of the modified virtual object based on the tilted orientation of the input controller.

5. The system of claim 2, wherein detecting the actuation of the actuator includes detecting selection of a feature of the virtual object, and wherein the single continuous movement of the user's body is indicative of a modification of the feature.

6. The system of claim 5, wherein the virtual object is stretched or compressed based on the modification of the feature.

7. The system of claim 1, further comprising a plurality of virtual objects, wherein each virtual object of the plurality of virtual objects is represented as a polyhedral volumetric object.

8. The system of claim 7, wherein the virtual object includes a first feature and a second feature, and wherein the system controller is configured to restrict the first feature based on at least one of the second feature of the virtual object and a third feature of at least one second virtual object of the plurality of virtual objects.

9. The system of claim 7, wherein the plurality of virtual objects includes the virtual object, which is a first virtual object, the plurality of virtual objects further including a second virtual object, and wherein the system controller is configured to combine the first virtual object and the second virtual object responsive to detecting a collision between the first virtual object and the second virtual object based on the object modification signal.

10. The system of claim 9, wherein detecting the collision between the first virtual object and the second virtual object includes:
    receiving the object modification signal, the object modification signal being indicative of the first virtual object being moved; and
    detecting an overlap between the first virtual object and the second virtual object based on the object modification signal.

11. The system of claim 1, wherein detecting the single continuous movement of the user's body includes detecting a single continuous three-dimensional movement indicative of a shape of a hole or an extrusion on a surface of the virtual object.

12. The system of claim 11, wherein detecting the single continuous movement of the user's body further includes detecting the single continuous three-dimensional movement towards or away from the surface of the virtual object, and wherein modifying the virtual object includes one of:
generating a hole in the virtual object based on the object modification signal indicating the single continuous three-dimensional movement towards the surface of the virtual object; and
generating an extrusion from the surface of the virtual object based on the object modification signal indicating the single continuous three-dimensional movement away from the surface of the virtual object.

13. A method of modeling architectural objects, the method comprising:
generating a three-dimensional simulated environment including a virtual object represented as a polyhedral volumetric object;
providing first display signals indicative of a field of view of the simulated environment to a display;
receiving one or more input signals including a signal indicative of a single continuous movement of a user's body;
modifying, based on the one or more input signals, the virtual object; and
providing second display signals indicative of the simulated environment including the modified virtual object to the display.

14. The method of claim 13, wherein receiving the one or more input signals includes receiving a signal indicative of a tilted orientation of an input controller, and wherein providing the second display signals indicative of the simulated environment including the modified virtual object includes providing display signals indicative of the simulated environment including a cross-section of the virtual object.

15. The method of claim 13, further comprising generating a plurality of virtual objects represented as polyhedral volumetric objects.

16. The method of claim 13, wherein the virtual object is a first virtual object, and wherein the method further comprises:
receiving the one or more input signals indicative of one of a movement of the first virtual object and a shape alteration of the first virtual object;
detecting a collision between the first virtual object and a second virtual object based on the one or more input signals; and
constraining the first virtual object relative to the second virtual object responsive to the collision.

17. The method of claim 16, wherein the shape alteration of the virtual object includes one of stretching and compressing the first virtual object based on a movement of a feature of the virtual object.

18. The method of claim 13, wherein modifying the virtual object includes detecting a shape of a hole or an extrusion on a surface of the virtual object based on a single continuous three-dimensional movement of the user.

19. The method of claim 18, wherein modifying the virtual object includes one of:
generating a hole in the virtual object based on the one or more input signals indicating the single continuous three-dimensional movement towards the surface of the virtual object; and
generating an extrusion from the virtual object based on the one or more input signals indicating the single continuous three-dimensional movement away from the surface of the virtual object.

20. A non-transitory computer readable medium storing sequences of computer-executable instructions for modeling architectural objects, the sequences of computer-executable instructions including instructions that instruct at least one processor to:
generate a three-dimensional simulated environment including a virtual object represented as a polyhedral volumetric object;
provide first display signals indicative of a field of view of the simulated environment to a display screen;
modify, based on one or more input signals indicative of a single continuous movement of a user's body, the virtual object; and
provide second display signals indicative of the modified virtual object in the field of view of the simulated environment to the display screen.

* * * * *